(12) United States Patent
Shiratsuchi et al.

(10) Patent No.: US 7,613,239 B2
(45) Date of Patent: Nov. 3, 2009

(54) DIGITAL SIGNAL OFFSET ADJUSTING APPARATUS AND PULSE PATTERN GENERATOR USING THE SAME

(75) Inventors: Satoru Shiratsuchi, Atsugi (JP); Kazuhiro Fujinuma, Ebina (JP); Sumio Saito, Atsugi (JP)

(73) Assignee: Anritsu Corporation, Atsugi-Shi (JP)

( * ) Notice: Subject to any disclaimer, the term of this patent is extended or adjusted under 35 U.S.C. 154(b) by 629 days.

(21) Appl. No.: 10/579,385

(22) PCT Filed: Sep. 29, 2005

(86) PCT No.: PCT/JP2005/018006

§ 371 (c)(1),
(2), (4) Date: May 11, 2006

(87) PCT Pub. No.: WO2006/035896

PCT Pub. Date: Apr. 6, 2006

(65) Prior Publication Data

US 2007/0129903 A1    Jun. 7, 2007

(30) Foreign Application Priority Data

Sep. 30, 2004    (JP)    ............................... 2004-286548

(51) Int. Cl.
*H03K 7/04*    (2006.01)
(52) U.S. Cl. ........................ 375/239; 375/130; 375/135; 375/146; 375/295; 375/296; 375/309; 375/312; 375/377
(58) Field of Classification Search ................. 375/130, 375/135, 146, 239, 295–296, 309, 312, 377, 375/316–319; 702/66
See application file for complete search history.

(56) References Cited

U.S. PATENT DOCUMENTS 3,950,711 A * 4/1976 Ohkawa ...................... 330/85

(Continued)

FOREIGN PATENT DOCUMENTS

JP    3-278645 A    12/1991

(Continued)

OTHER PUBLICATIONS

International Preliminary Report on Patentability, Chapter I of the Patent Cooperation Treaty, and Written Opinion of the International Searching Authority, dated Apr. 12, 2007, for PCT/JP2005/018006, 5 sheets.

*Primary Examiner*—Mohammad H Ghayour
*Assistant Examiner*—Sophia Vlahos
(74) *Attorney, Agent, or Firm*—Frishauf, Holtz, Goodman & Chick, P.C.

(57) ABSTRACT

A digital signal offset adjusting apparatus has a capacitor causing an output terminal to pass a high frequency band of an input digital signal. A first coil has one end connected to an input terminal and a second coil has one end connected to an output. An operational amplifier has an input connected to another end of the first coil, a second input connected to a direct current voltage generator and an output connected to another end of the second coil. The operational amplifier outputs a signal obtained by subtracting and combining the low frequency band, the direct current component and a direct current bias voltage. A frequency characteristic compensating circuit is connected between a reference point and the second input of the operational amplifier. The gain of the operational amplifier increases with a component having a higher frequency from among low frequency bands of the input digital signal.

20 Claims, 17 Drawing Sheets

U.S. PATENT DOCUMENTS

| | | | |
|---|---|---|---|
| 4,255,812 A * | 3/1981 | Huellwegen | 375/214 |
| 4,441,080 A * | 4/1984 | Saari | 330/86 |
| 5,883,591 A * | 3/1999 | McEwan | 342/22 |
| 6,573,788 B2 * | 6/2003 | Oppelt | 330/61 A |

FOREIGN PATENT DOCUMENTS

| | | |
|---|---|---|
| JP | 4-47835 A | 1/1992 |
| JP | 2004-193275 A | 7/2004 |
| JP | 2004-193866 A | 7/2004 |

* cited by examiner

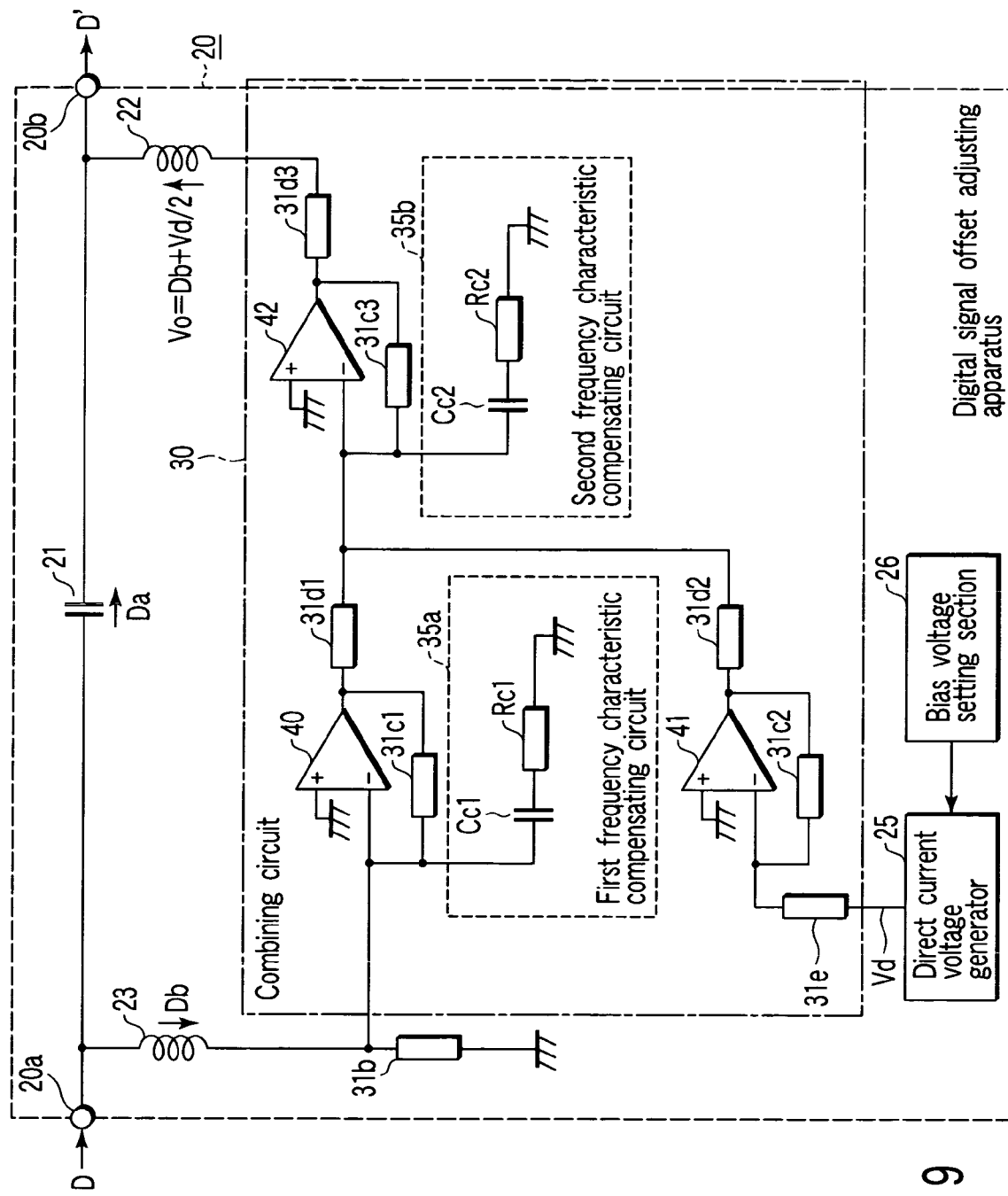
F I G. 9

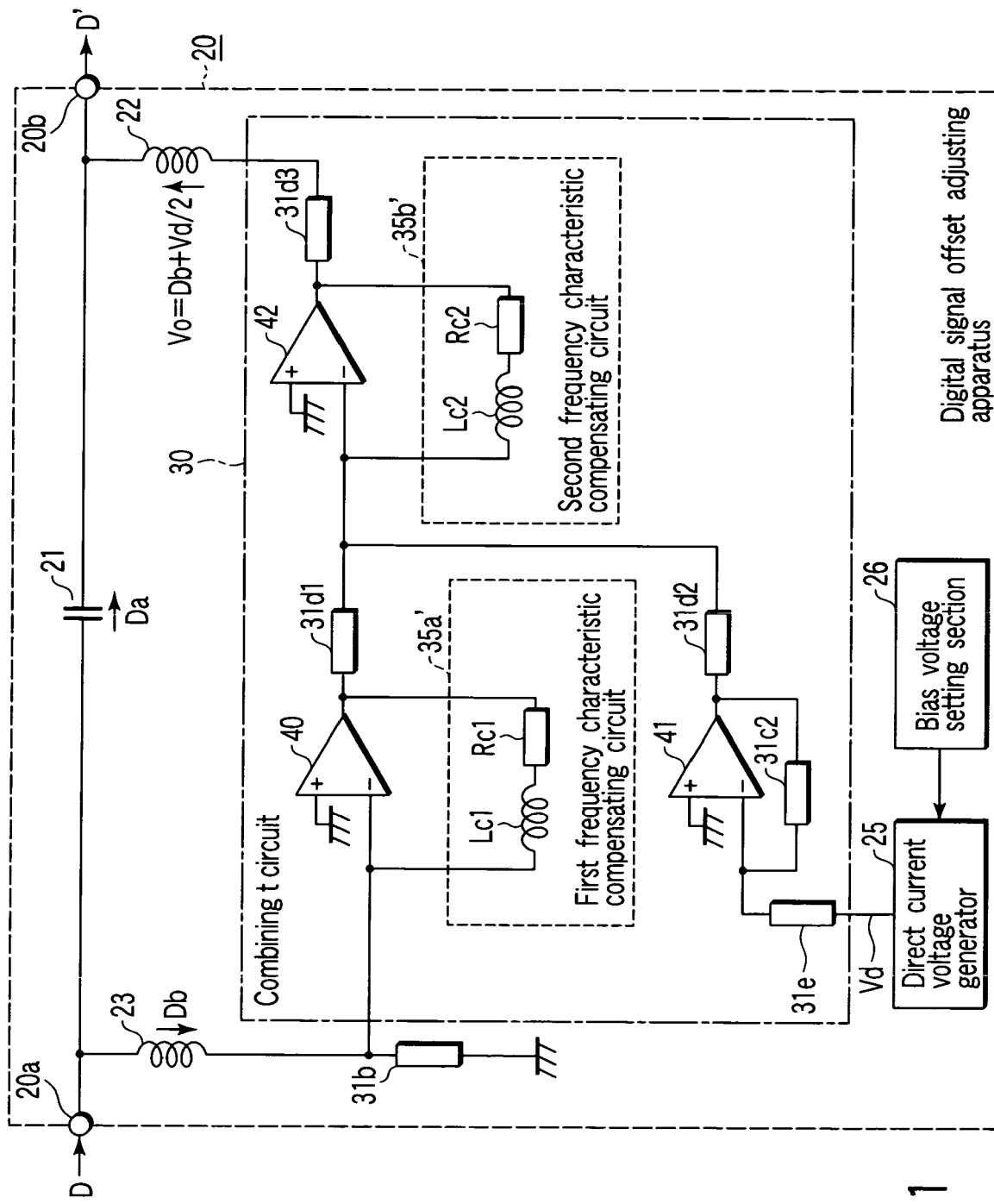
F I G. 11

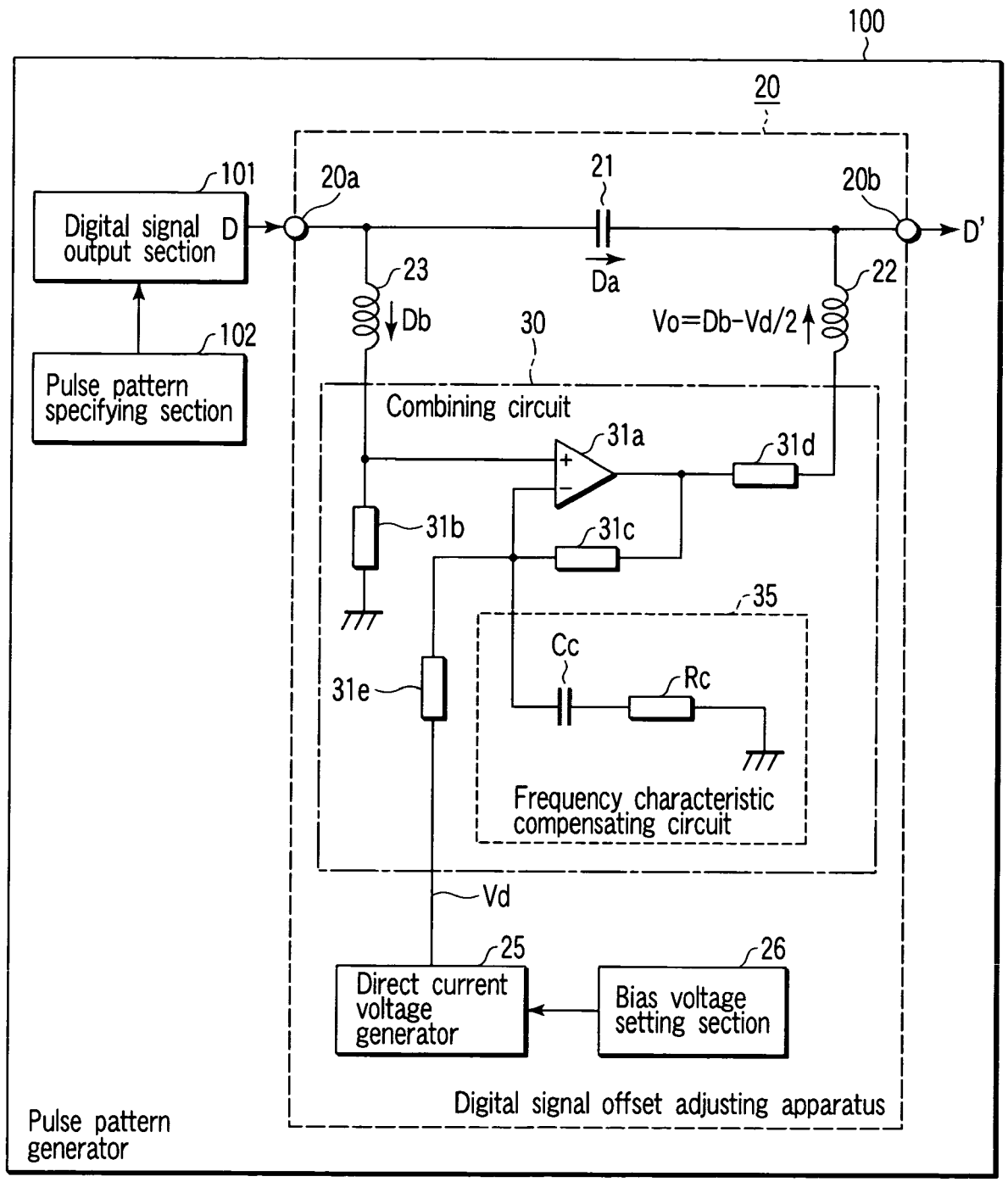
F I G. 12

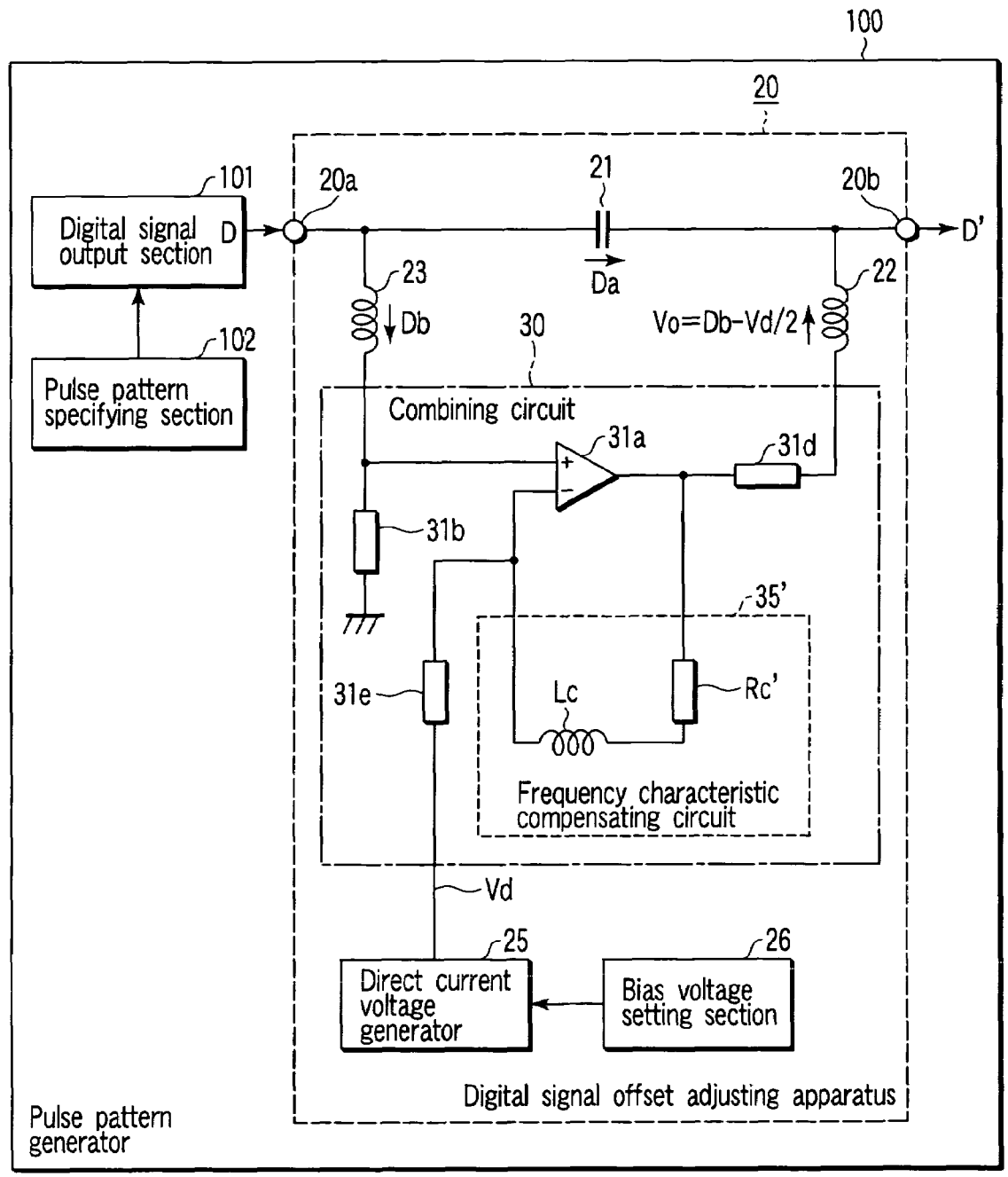
F I G. 14

DIGITAL SIGNAL OFFSET ADJUSTING APPARATUS AND PULSE PATTERN GENERATOR USING THE SAME

This application is a U.S. National Phase Application under 35 USC 371 of International Application PCT/JP2005/018006 filed Sep. 29, 2005.

TECHNICAL FIELD

The present invention relates to a digital signal offset adjusting apparatus and a pulse pattern generator using the apparatus.

In particular, the present invention relates to a digital signal offset adjusting apparatus for applying and outputting an arbitrary bias voltage to a digital signal for use in the case of carrying out testing or the like of a variety of devices used for a communication system, the digital signal offset adjusting apparatus employing a technique for responding to a wideband digital signal, and a pulse pattern generator using the apparatus.

BACKGROUND ART

A communication speed of a communication system using a digital signal becomes high year by year, and extends from a conventional low speed digital signal having a MHz band to a high speed digital signal having a GHz band in recent years.

Therefore, in the case of carrying out testing of a variety of devices for use in such a communication system, the pulse generator needs to supply a high speed digital signal having a GHz band from a low speed digital signal having a MHz band as a digital signal having applied thereto offset adjustment so as to apply a bias voltage in response to an input interface of equipment targeted to be tested.

As an example, in the case where an output amplitude of a digital signal is from 0.25 Vpp to 2 Vpp (in steps of 2 mV), a bias voltage ranges from −2V to +2V (in steps of 1 mV).

FIG. 7 shows a configuration of a conventional digital signal offset adjusting apparatus 10 used for such a purpose as above described.

This apparatus is generally called a "bias T", and transmits an alternating current component Dac of a digital signal D input from an input terminal 10a to an output terminal 10b via a capacitor 11.

In addition, one end of a bias applying coil 12 is provided at a terminal at the side of the output terminal 10b of the capacitor 11.

Then, an arbitrary bias voltage Vb is applied from the other end of this bias applying coil 12, whereby a digital signal D' obtained by superimposing the alternating current component Dac and the bias voltage Vb having passed through the capacitor 11 for signal transmission is output from the output terminal 10b.

A bias T as described above is described in the following patent documents 1 and 2, for example.

Patent document 1: Jpn. Pat. Appln. KOKAI Publication No. 2004-193275

Patent document 2: Jpn. Pat. Appln. KOKAI Publication No. 2004-193866

DISCLOSURE OF INVENTION

However, in the above-described conventional digital signal offset adjusting apparatus, it is necessary to increase a capacitance of a capacitor 11 for signal transmission connected between an input terminal 10a and an output terminal 10b in order to correctly transmit a waveform of a digital signal having a low frequency band, and concurrently, an inductance of a bias applying coil 12 must be increased.

In particular, in testing of a variety of devices for use in a communication system, in the case of a commonly used digital signal of a random pattern which is generated from a pulse pattern generator, there exists a data pattern such that identical bit data are continuous, and a frequency included in that data pattern may be lower than a bit rate of the digital signal itself.

Thus, as a digital signal offset adjusting apparatus, even in respect of a digital signal whose bit rate is in the order of several Mbps, it is necessary to transmit a low frequency band up to some hundred Hz, for example, which is significantly lower than the digital signal, without a loss.

In this way, in order to transmit a low frequency band without loss, a capacitor having a large capacitance is used as a capacitor for signal transmission, and concurrently, the inductance of the bias applying coil 12 must be increased.

However, as described above, the signal transmission capacitor having a large capacitance (for example, 100 μF) and the bias applying coil having a large inductance (for example, some tens of mH) are inevitably large in its physical size.

This causes higher cost of an entire digital signal offset adjusting apparatus, and it becomes significantly difficult to match impedance of a high frequency transmission channel in a digital signal offset adjusting apparatus. There is a problem that a high frequency band of a digital signal, in particular, a signal component of GHz band cannot be correctly transmitted, and a waveform distortion occurs.

In addition, a component close to a direct current component may be included depending on a pattern of a digital signal.

Hence, there is a problem that, in the conventional digital signal offset adjusting apparatus, a component close to an existing direct current component cannot be correctly transmitted by a pattern of a digital signal, and a waveform distortion occurs.

Therefore, the present invention has been made in order to solve a problem using a conventional technique as described above. For example, it is an object of the present invention to provide a digital signal offset adjusting apparatus and a pulse pattern generator using the apparatus capable of correctly transmitting a wideband digital signal including a direct current component and a low frequency band to a high frequency band ranging from a several hundred of Hz to GHz without generating waveform distortion.

In order to achieve the above-described object, according to a first aspect of the present invention, there is provided a digital signal offset adjusting apparatus comprising: an input terminal (20a) to which an input digital signal having a wideband frequency characteristic including a low frequency band, a direct current component, and a high frequency band is input; a direct current voltage generator (25) which outputs a desired direct current bias voltage; an output terminal (20b) to output an output digital signal obtained by applying the direct current bias voltage output from the direct current voltage generator (25) to the low frequency band, the direct current component, and the high frequency band of the input digital signal input to the input terminal (20a); a capacitor (21) which is connected between the input terminal (20a) and the output terminal (20b) and which causes the output terminal (20b) to pass through the high frequency band of the input digital signal input to the input terminal (20a); a first coil (23), one end of which is connected to the input terminal (20a), and which passes the low frequency band and the direct current component of the input digital signal to another end; a second coil (22), one end of which is connected to the output terminal (20b); a operational amplifier (31a), a first input end of which is connected to the other end of the first coil (23), a second input end of which is connected to the direct current voltage generator (25), an output end of which is connected to another end of the second coil (22), and which outputs to the output terminal (20b) via the other end of the second coil (22) from the output end, the low frequency band of the input digital signal passed to the other end of the first coil (23) input to the first and second input ends and a composite signal obtained by combining the direct current component and the direct current bias voltage output from the direct current voltage generator (25); and a frequency characteristic compensating circuit (35) connected between a reference electrical potential point (earth line) and the second input end of the operational amplifier (31a) or between the second input end and the output end, the compensating circuit being adopted to compensate for a frequency characteristic so that a gain of the operational amplifier (31a) increases with a component having a higher frequency from among the low frequency bands of the input digital signal passed to the other end of the first coil (23).

Further, in order to achieve the above-described object, according to a second aspect of the present invention, there is provided the digital signal offset adjusting apparatus according to the first aspect, wherein, when the first and second input ends of the operational amplifier (31a) are a non-inverted input (+) end and an inverted input end (−), respectively, an input matching resistor (31b) having a predetermined value is connected between the reference electrical potential point (earth line) and the non-inverted input end (+) of the operational amplifier (31a), a feedback resistor (31c) is connected between the output end and the inverted input (−) end of the operational amplifier (31a), an output matching resistor (31d) having a predetermined value is connected between the output end of the operational amplifier (31a) and the other end of the second coil (22), and a direct current inputting resistor (31e) having a predetermined value is connected between the inverted input end (−) of the operational amplifier (31a) and the direct current voltage generator (25), whereby a subtracted and combined signal obtained by subtracting and combining by the operational amplifier (31a) the low frequency band and the direct current component of the input digital signal passed to the other end of the first coil (23) input to the inverted input end (−) of the operational amplifier (31a) and the direct current bias voltage from the direct current voltage generator (25) input to the non-inverted input end (+) of the operational amplifier (31a) is output to the output terminal (20b) via the other end of the second coil (22) from the output end of the operational amplifier (31a).

Further, in order to achieve the above-described object, according to a third aspect of the present invention, there is provided the digital signal offset adjusting apparatus according to the second aspect, wherein the direct current inputting resistor (31e) connected between the inverted input end (−) of the operational amplifier (31a) and the direct current voltage generator (25) has a value equal to a value of the feedback resistor (31c) connected between the output end of the operational amplifier (31a) and the inverted input end (−) as the predetermined value, and the frequency characteristic compensating circuit (35) is composed of a capacitor (Cc) and a resistor (Rc) connected in serial between the inverted input end (−) and the reference electronic potential point (earth line) of the operational amplifier (31a).

Further, in order to achieve the above-described object, according to a fourth aspect of the present invention, there is provided the digital signal offset adjusting apparatus according to the second aspect, wherein the frequency characteristic compensating circuit (35) is composed of a serial circuit of a coil (Lc) and a resistor (Rc') connected between the output end and the inverted input end (−) of the operational amplifier (31a), and the direct current inputting resistor (31e) connected between the inverted input end (−) of the operational amplifier (31a) and the direct current voltage generator (25) has a value equal to a parallel combined resistance value of the feedback resistor (31c) of the operational amplifier (31a) and the resistor (Rc') of the frequency characteristic compensating circuit (35) as the predetermined value.

Further, in order to achieve the above-described object, according to a fifth aspect of the present invention, there is provided the digital signal offset adjusting apparatus according to the fourth aspect, wherein the frequency characteristic compensating circuit (35') is compatible with the feedback resistor (31c) connected between the output end and the inverted input end (−) of the operational amplifier (31a) by means of the resistor (Rc') of the frequency characteristic compensating circuit (35'), and is composed of a coil (Lc) connected in series between the resistor (Rc') compatible with the feedback resistor (31c) and the inverted input end (−) of the operational amplifier (31a), and a resistance value of the resistor (Rc') of the frequency characteristic compensating circuit (35') compatible with the feedback resistor (31c) of the operational amplifier (31a) is set to be equal to a resistance value of the direct current inputting resistor (31e) from the direct current voltage generator (25).

Further, in order to achieve the above-described object, according to a sixth aspect of the present invention, there is provided a digital signal offset adjusting apparatus comprising: an input terminal (20a) to which an input digital signal having a wideband frequency characteristic including a low frequency band, a direct current component, and a high frequency band is input; a direct current voltage generator (25) which outputs a desired direct current bias voltage; an output terminal (20b) to output an output digital signal obtained by applying the direct current bias voltage output from the direct current voltage generator (25) to the low frequency band, the direct current component, and the high frequency band of the input digital signal input to the input terminal (20a); a capacitor (21) which is connected between the input terminal (20a) and the output terminal (20b) and which causes the output terminal (20b) to pass through the high frequency band of the input digital signal input to the input terminal (20a); a first coil (23) whose one end is connected to the input terminal (20a), and which passes the low frequency band and the direct current component of the input digital signal to another end; a second coil (22) whose one end is connected to the output terminal (20b); a first operational amplifier (40), a first input end of which is connected to the other end of the first coil (23), a second input end of which is connected to a reference electrical potential point (earth line), and which outputs from an output end a first inverted and amplified signal obtained by inverting and amplifying the low frequency band and the direct current component of the input digital signal passed to the other end of the first coil (23); a second operational amplifier (41), a first input end of which is connected to the direct current voltage generator (25), a second input end of which is connected to the reference electrical potential point (earth line), and which outputs from an output end a second inverted and amplified signal obtained by inverting and amplifying the direct current bias voltage output from the direct current voltage generator (25); a third operational amplifier (42), a first input end of which is connected in common to each of the output ends of the first and second operational amplifiers (40,

41), a second input end of which is connected to the reference electrical potential point (earth line), and which inverts and amplifies a combined signal obtained by combining the first and second inverted and amplified signals and outputs the inverted and amplified signal to another end of the second coil (22); and first and second frequency characteristic compensating circuits (35a, 35b) connected between the reference electrical potential point (earth line) and each of the first input end of the first and third operational amplifiers (40, 42) or between each of the first input end and the output end of the first and third operational amplifiers (40, 42), the first and second frequency characteristic compensating circuits being adopted to compensate for a frequency characteristic so that a gain of each of the first and third operational amplifiers (40, 42) increases with a component having a higher frequency from among the low frequency bands of the input digital signal passed to the other end of the first coil (23).

Further, in order to achieve the above-described object, according to a seventh aspect of the present invention, there is provided the digital signal offset adjusting apparatus according to the sixth aspect, wherein, when the first and second input ends of the first to third operational amplifiers (40, 41, 42) are an inverted input end (−) and a non-inverted input end (+), respectively, each of the non-inverted input ends (+) of the first to third operational amplifiers (40, 41, 42) is connected to the reference electrical potential point (earth line), an input matching resistor (31b) having a predetermined value is connected between the inverted input end (−) and the reference electrical potential point (earth line) of the first operational amplifier (40), first to third feedback resistors (31c1, 31c2, 31c3) are connected, respectively, between the output end and the inverted input end (−) of each of the first to third operational amplifiers (40, 41, 42), a direct current inputting resistor (31e) having a predetermined value is connected between the inverted input end (−) of the second operational amplifier (41) and the direct current voltage generator (25), first and second output matching resistors (31d1, 31d2) each having a predetermined value are connected, respectively, between each of the output end of the first and second operational amplifiers (40, 41) and the inverted input end (−) of the third operational amplifier (42), and a third output matching resistor (31d3) having the predetermined value is connected between the output end of the third operational amplifier (42) and the other end of the second coil (22), whereby an added and combined signal obtained by adding and combining the first and second inverted and amplified signals output from each of the output ends of the first and second operational amplifiers (40, 41) is output to the output terminal (20b) via the other end of the second coil (22) from the output end of the third operational amplifier (42) which inverts and amplifies the added and combined signal.

Further, in order to achieve the above-described object, according to an eighth aspect of the present invention, there is provided the digital signal offset adjusting apparatus according to the seventh aspect, wherein the direct current inputting resistor (31e) connected between the inverted input end (−) of the second operational amplifier (41) and the direct current voltage generator (25) has a value equal to a value of the second feedback resistor (31c2) connected between the output end and the inverted input end (−) of the second operational amplifier (41) as the predetermined value, and the first and second frequency characteristic compensating circuits (35a, 35b) are composed of a capacitor (Cc1, Cc2) and a resistor (Rc1, Rc2) connected in series, respectively, between the reference electrical potential point (earth line) and each of the inverted input end (−) of the first and third operational amplifiers (40, 42).

Further, in order to achieve the above-described object, according to a ninth aspect of the present invention, there is provided the digital offset adjusting apparatus according to the seventh aspect, wherein the direct current inputting resistor (31e) connected between the inverted input end (−) of the second operational amplifier (41) and the direct current voltage generator (25) has a value equal to a value of the second feedback resistor (31c2) connected between the output end and the inverted input end (−) of the second operational amplifier (41) as the predetermined value, and the first and second frequency characteristic compensating circuits (35a, 35b) are composed of a serial circuit of a coil (Lc1, Lc2) and a resistor (Rc1, Rc2) connected between each of the output end and the inverted input end (−) of the first and third operational amplifiers (40), respectively.

Further, in order to achieve the above-described object, according to a tenth aspect of the present invention, there is provided the digital offset adjusting apparatus according to the ninth aspect, wherein the first and second frequency characteristic compensating circuits (35a', 35b') are compatible with the first and third feedback resistors (31c1, 31c2) connected between the output end and the inverted input end (−) of each of the first and third operational amplifiers (40, 42) by a resistor (Rc1, Rc2) of each of the first and second frequency characteristic compensating circuits (35a', 35b'), respectively, and are composed of a coil (Lc1, Lc2) connected in series between each of the resistors (Rc1, Rc2) compatible with the first and third feedback resistors (31c1, 31c2) and each of the inverted input ends (−) of the first and third operational amplifiers (40, 42).

Further, in order to achieve the above-described object, according to an eleventh aspect of the present invention, there is provided a pulse pattern generator comprising: a digital signal output section (101) which outputs a digital signal having a wideband frequency characteristic including a low frequency band, a direct current component, and a high frequency band, the digital signal being of a desired pulse pattern including a data pattern such that identical bit data are continuous; and a digital signal offset adjusting apparatus (20) connected to the digital signal output section (101), wherein the digital signal offset adjusting apparatus (20) comprises: an input terminal (20a) to which a digital signal of a desired pulse pattern having a wideband frequency characteristic including the low frequency band, the direct current component, and the high frequency band output from the digital signal output section (101) is input as an input digital signal; a direct current voltage generator (25) which outputs a desired direct current bias voltage; an output terminal (20b) to output an output digital signal obtained by applying the direct current bias voltage output from the direct current voltage generator (25) to the low frequency band, the direct current component, and the high frequency band of the input digital signal input to the input terminal (20a); a capacitor (21) which is connected between the input terminal (20a) and the output terminal (20b), and which causes the output terminal to pass through the high frequency band of the input digital signal input to the input terminal (20a); a first coil (23), one end of which is connected to the input terminal (20a), and which passes the low frequency band and the direct current component of the input digital signal to another end; a second coil (22), one end of which is connected to the output terminal (20b); a operational amplifier (31a), a first input end of which is connected to the other end of the first coil (23), a second input end of which is connected to the direct current voltage generator (25), an output end of which is connected to another end of the second coil (22), and which outputs to the output terminal (20b) via the other end of the second coil (22) from the output end, the low frequency band of the input digital signal passed to the other end of the first coil (23) input to the first and second input ends and a composite signal obtained by combining the direct current component and the direct current bias voltage output from the direct current voltage generator (25); and a frequency characteristic compensating circuit (35) connected between a reference electrical potential point (earth line) and the second input end of the operational amplifier (31a) or between the second input end and the output end, the compensating circuit being adopted to compensate for a frequency characteristic so that a gain of the operational amplifier (31a) increases with a component having a higher frequency from among the low frequency bands of the input digital signal passed to the other end of the first coil (23).

Further, in order to achieve the above-described object, according to a twelfth aspect of the present invention, there is provided the pulse pattern generator according to the eleventh aspect, wherein, when the first and second input ends of the operational amplifier (31a) of the digital signal offset adjusting apparatus (20) are a non-inverted input end (+) and an inverted input end (−), respectively, an input matching resistor (31b) having a predetermined value is connected between the reference electrical potential point (earth line) and the non-inverted input end (+) of the operational amplifier (31a), a feedback resistor (31c) is connected between the output end and the inverted input end (−) of the operational amplifier (31a), an output matching resistor (31d) having a predetermined value is connected between the output end of the operational amplifier (31a) and the other end of the second coil (22), and a direct current inputting resistor (31e) having a predetermined value is connected between the inverted input end (−) of the operational amplifier (31a) and the direct current voltage generator (25), whereby a subtracted and combined signal obtained by subtracting and combining by the operational amplifier (31a) the low frequency band and the direct current component of the input digital signal passed to the other end of the first coil (23) input to the non-inverted input end (+) of the operational amplifier (31a) and the direct current bias voltage from the direct current voltage generator (25) input to the inverted input end (−) of the operational amplifier (31a) is output to the output terminal (20b) via the other end of the second coil (22) from the output end of the operational amplifier (31a).

Further, in order to achieve the above-described object, according to a thirteenth aspect of the present invention, there is provided the pulse pattern generator according to the twelfth aspect, wherein the direct current inputting resistor (31e) connected between the inverted input end (−) of the operational amplifier (31a) and the direct current voltage generator (25) has a value equal to a value of the feedback resistor (31c) connected between the output end of the operational amplifier (31a) and the inverted input end (−) as the predetermined value, and the frequency characteristic compensating circuit (35) is composed of a capacitor (Cc) and a resistor (Rc) connected in serial between the inverted input end (−) and the reference electronic potential point (earth line) of the operational amplifier (31a).

Further, in order to achieve the above-described object, according to a fourteenth aspect of the present invention, there is provided the pulse pattern generator according to the twelfth aspect, wherein the frequency characteristic compensating circuit (35) is composed of a serial circuit of a coil (Lc) and a resistor (Rc') connected between the output end and the inverted input end (−) of the operational amplifier (31a), and the direct current inputting resistor (31e) connected between the inverted input end (−) of the operational amplifier (31a) and the direct current voltage generator (25) has a value equal to a parallel combined resistance value of the feedback resistor (31c) of the operational amplifier (31a) and the resistor (Rc') of the frequency characteristic compensating circuit (35) as the predetermined value.

Further, in order to achieve the above-described object, according to a fifteenth aspect of the present invention, there is provided the pulse pattern generator according to the twelfth aspect, wherein the direct current inputting resistor (31e) has a value equal to a value of the feedback resistor (31c) as the predetermined value, the frequency characteristic compensating circuit (35') is compatible with the feedback resistor (31c) connected between the output end and the inverted input end (−) of the operational amplifier (31a) by means of the resistor (Rc') of the frequency characteristic compensating circuit (35'), and is composed of a coil (Lc) connected in series between the resistor (Rc') compatible with the feedback resistor (31c) and the inverted input end (−), and a resistance value of the resistor (Rc') of the frequency characteristic compensating circuit (35') compatible with the feedback resistor (31c) of the operational amplifier (31a) is set to be equal to a resistance value of the direct current inputting resistor (31e) from the direct current voltage generator (25).

Further, in order to achieve the above-described object, according to a sixteenth aspect of the present invention, there is provided a pulse pattern generator comprising: a digital signal output section (101) which outputs a digital signal having a wideband frequency characteristic including a low frequency band, a direct current component, and a high frequency band, the digital signal being of a desired pulse pattern including a data pattern such that identical bit data are continuous; and a digital signal offset adjusting apparatus (20) connected to the digital signal output section (101), wherein the digital signal offset adjusting apparatus (20) comprises: an input terminal (20a) to which a digital signal of a desired pulse pattern having a wideband frequency characteristic including the low frequency band, the direct current component, and the high frequency band output from the digital signal output section (101) is input as an input digital signal; a direct current voltage generator (25) which outputs a desired direct current bias voltage; an output terminal (20b) to output an output digital signal obtained by applying the direct current bias voltage output from the direct current voltage generator (25) to the low frequency band, the direct current component, and the high frequency band of the input digital signal input to the input terminal (20a); a capacitor (21) which is connected between the input terminal (20a) and the output terminal (20b), and which causes the output terminal (20b) to pass through the high frequency band of the input digital signal input to the input terminal (20a); a first coil (23), one end of which is connected to the input terminal (20a), and which passes the low frequency band and the direct current component of the input digital signal to another end; a second coil (22), one end of which is connected to the output terminal (20b); a first operational amplifier (40), a first input end of which is connected to the other end of the first coil (23), a second input end of which is connected to a reference electrical potential point (earth line), and which outputs from an output end a first inverted and amplified signal obtained by inverting and amplifying the low frequency band and the direct current component of the input digital signal passed to the other end of the first coil (23); a second operational amplifier (41), a first input end of which is connected to the direct current voltage generator (25), a second input end of which is connected to the reference electrical potential point (earth line), and which outputs from an output end a second inverted and amplified signal obtained by inverting and amplifying the direct current bias voltage output from the direct current voltage generator (25); a third operational amplifier (42), a first input end of which is connected in common to each of the output ends of the first and second operational amplifiers (40, 41), a second input end of which is connected to the reference electrical potential point (earth line), and which inverts and amplifies a combined signal obtained by combining the first and second inverted and amplified signals and outputs the inverted and amplified signal to another end of the second coil (22); and first and second frequency characteristic compensating circuits (35*a*, 35*b*) connected between the reference electrical potential point (earth line) and each of the first input end of the first and third operational amplifiers (40, 42) or between each of the first input end and the output end of the first and third operational amplifiers (40, 42), the first and second frequency characteristic compensating circuits being adopted to compensate for a frequency characteristic so that a gain of each of the first and third operational amplifiers (40, 42) increases with a component having a higher frequency from among the low frequency bands of the input digital signal passed to the other end of the first coil (23).

Further, in order to achieve the above-described object, according to a seventeenth aspect of the present invention, there is provided the pulse pattern generator according to the sixteenth aspect, wherein, when the first and second input ends of the first to third operational amplifiers (40, 41, 42) of the digital signal offset adjusting apparatus (20) are an inverted input end (−) and a non-inverted input end (+), respectively, each of the non-inverted input ends (+) of the first to third operational amplifiers (40, 41, 42) is connected to the reference electrical potential point (earth line), an input matching resistor (31*b*) having a predetermined value is connected between the reference electrical potential point (earth line) and the inverted input end (−) of the first operational amplifier (40), first to third feedback resistors (31*c*1, 31*c*2, 31*c*3) are connected, respectively, between the output end and the inverted input end (−) of each of the first to third operational amplifiers (40, 41, 42), a direct current inputting resistor (31*e*) having a predetermined value is connected between the inverted input end (−) of the second operational amplifier (41) and the direct current voltage generator (25), first and second output matching resistors (31*d*1, 31*d*2) each having a predetermined value are connected, respectively, between the output end of each of the first and second operational amplifiers (40, 41) and the inverted input end (−) of the third operational amplifier (42), and a third output matching resistor (31*d*3) having the predetermined value is connected between the output end of the third operational amplifier (42) and the other end of the second coil (22), whereby an added and combined signal obtained by adding and combining the first and second inverted and amplified signals output from each of the output ends of the first and second operational amplifiers (40, 41) is output to the output terminal (20*b*) via the other end of the second coil (22) from the output end of the third operational amplifier (42) which inverts and amplifies the added and combined signal.

Further, in order to achieve the above-described object, according to an eighteenth aspect of the present invention, there is provided the pulse pattern generator according to the seventeenth aspect, wherein the direct current inputting resistor (31*e*) connected between the inverted input end (−) of the second operational amplifier (41) and the direct current voltage generator (25) has a value equal to a value of the second feedback resistor (31*c*2) connected between the output end and the inverted input end (−) of the second operational amplifier (41) as the predetermined value, and the first and second frequency characteristic compensating circuits (35*a*, 35*b*) are composed of a capacitor (Cc1, Cc2) and a resistor (Rc1, Rc2) connected in series, respectively, between the reference electrical potential point (earth line) and each of the inverted input end (−) of the first and second operational amplifiers (40, 41).

Further, in order to achieve the above-described object, according to a nineteenth aspect of the present invention, there is provided the pulse pattern generator according to the seventeenth aspect, wherein the direct current inputting resistor (31*e*) connected between the inverted input end (−) of the second operational amplifier (41) and the direct current voltage generator (25) has a value equal to a value of the second feedback resistor (31*c*2) connected between the output end and the inverted input end (−) of the second operational amplifier (41) as the predetermined value, and the first and second frequency characteristic compensating circuits (35*a*, 35*b*) are composed of a serial circuit of a coil (Lc1, Lc2) and a resistor (Rc1, Rc2) connected between each of the output end and the inverted input end (−) of the first and third operational amplifiers (40, 42), respectively.

Further, in order to achieve the above-described object, according to a twentieth aspect of the present invention, there is provided the pulse pattern generator according to the nineteenth aspect, wherein the first and second frequency characteristic compensating circuits (35*a*', 35*b*') are compatible with the first and third feedback resistors (31*c*1, 31*c*3) connected between the output end and the inverted input end (−) of each of the first and third operational amplifiers (40) by a resistor (Rc1, Rc2) of each of the first and second frequency characteristic compensating circuits (35*a*', 35*b*'), respectively, and are composed of a coil (Lc1, Lc2) connected in series between each of the resistors (Rc1, Rc2) compatible with the first and third feedback resistors (31*c*1, 31*c*3) and each of the inverted input ends (−) of the first and third operational amplifiers (40).

BRIEF DESCRIPTION OF DRAWINGS

FIG. 9 is a connection diagram showing a configuration of a fourth embodiment of a digital signal offset adjusting apparatus according to the present invention;

FIG. 11 is a connection diagram showing a configuration of a pulse pattern generator according to a sixth embodiment of the present invention;

FIG. 12 is a connection diagram showing a configuration of a pulse pattern generator according to a seventh embodiment of the present invention;

FIG. 14 is a connection diagram showing a configuration of a pulse pattern generator according to a ninth embodiment of the present invention;

BEST MODE FOR CARRYING OUT THE INVENTON

Hereinafter, with reference to the accompanying drawings, a description will be given with respect to some embodiments of a digital signal offset adjusting apparatus and a pulse pattern generator using the apparatus according to the present invention.

First Embodiment

Figure 1:
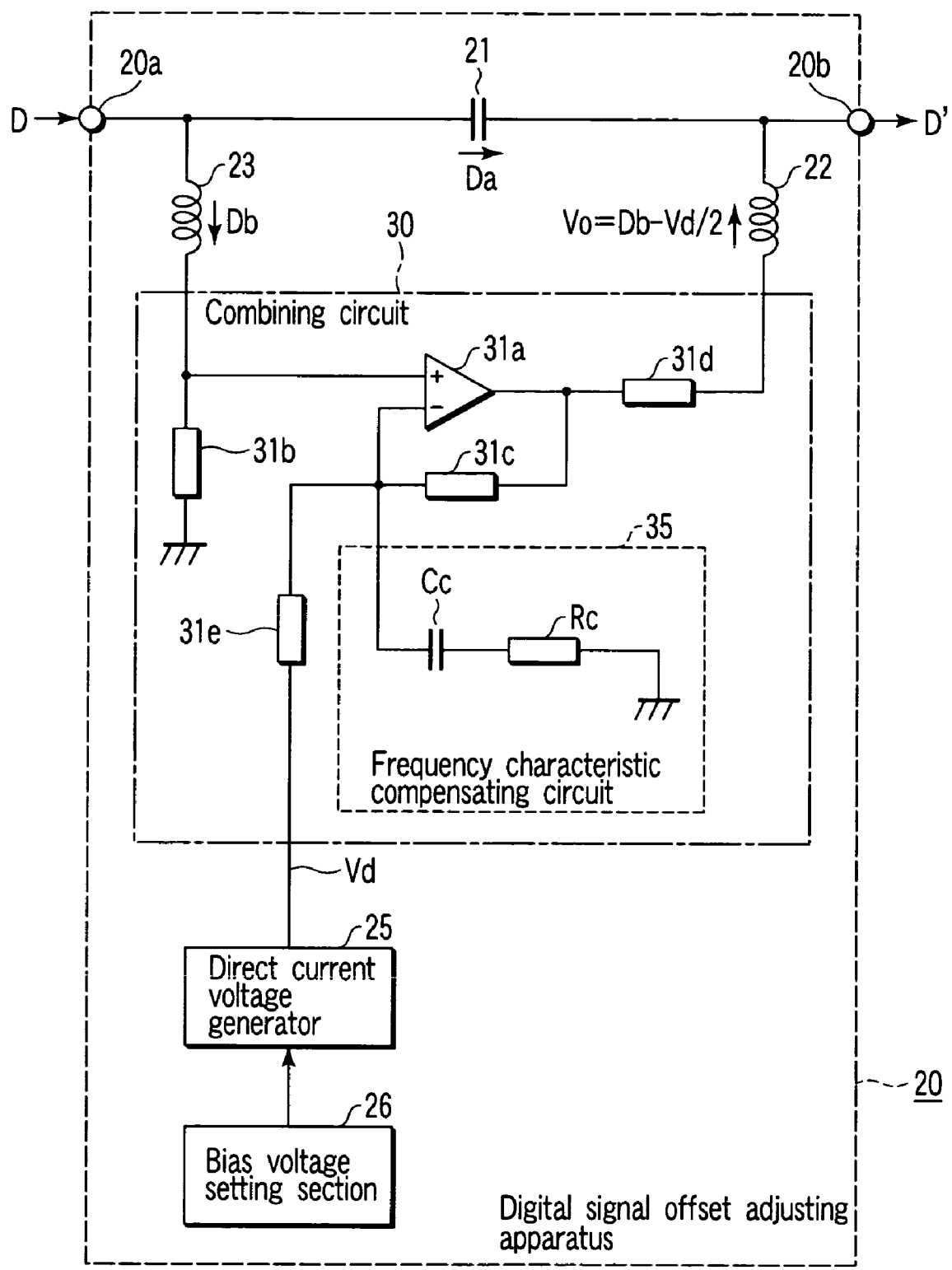
FIG. 1 is a connection diagram showing a configuration of a first embodiment of a digital signal offset adjusting apparatus according to the present invention.

FIG. 1 shows a circuit configuration of a digital signal offset adjusting apparatus 20 according to a first embodiment of the present invention.

This digital signal offset adjusting apparatus 20 according to the first embodiment shown in FIG. 1 has basic constituent elements such as: an input terminal 20a having input thereto an input digital signal having a wideband frequency characteristic including a direct current component and a low frequency band to a high frequency band; a direct current voltage generator 25 for outputting a desired direct current bias voltage; an output terminal 20b for outputting an output digital signal obtained by applying the direct current bias voltage output from the direct current voltage generator 25 to a low frequency band, a direct current component, and a high frequency band of an input digital signal input to the input terminal 20a; a capacitor 21 connected between the input terminal 20a and the output terminal 20b, the capacitor causing the output terminal to pass through a high frequency band of an input digital signal input to the input terminal 20a; a first coil 23 whose one end is connected to the input terminal 20a, and which passes a low frequency band and a direct current component of an input digital signal to another end; a second coil 22 whose one end is connected to the output terminal 20b; a operational amplifier 31a, a first input end of which is connected to the other end of the first coil 23, a second input end of which is connected to the direct current voltage generator 25, an output end of which is connected to the other end of the second coil 22, the operational amplifier outputting to the output terminal 20b via another end of the second coil 22 from an output end, the low frequency band of the input digital signal passed to the other end of the first coil 23 input to the first and second input ends and a composite signal obtained by combining the direct current component and the direct current bias voltage output from the direct current voltage generator 25; and a frequency characteristic compensating circuit 35 connected between a reference electrical potential point (earth line) and the second input end of the operational amplifier 31a or between the second input end and an output end, the compensating circuit being adopted to compensating for a frequency characteristic so that a gain of the operational amplifier 31a increases with a component having a higher frequency from among low frequency bands of input digital signals passed to the other end of the first coil 23.

Specifically, as shown in FIG. 1, between the input terminal 20a and the output terminal 20b of the digital signal offset adjusting apparatus 20, like the conventional digital signal offset adjusting apparatus, there is connected the capacitor 21 for passing an alternating current component (hereinafter, referred to as a high frequency band) Da having a predetermined frequency or more included in the digital signal D input from the input terminal 20a.

In addition, one end of the bias applying coil (second coil) 22 is connected to the output terminal 20b.

In addition, to the input terminal 20a, for example, from among frequency components of the digital signal D input from a digital signal output section of a pulse pattern generator described later, there is connected one end of a low frequency extracting coil (first coil) 23 for extracting a signal Db including a component greatly attenuated by the capacitor 21 (component which cannot be passed), i.e., a component equal to or smaller than the predetermined frequency, (hereinafter, referred to as a low frequency band) and a direct current component.

Although the inductance of this low frequency extracting coil 23 may be different from that of the bias applying coil 22, this inductance is defined to be equal here.

The signal Db including the low frequency band and direct current component sampled by the low frequency extracting coil 23 is input to a combining circuit 30 together with an direct current signal Ddc of an arbitrary voltage Vd output from the direct current voltage generator 25.

Here, the arbitrary voltage Vd output from the direct current voltage generator 25 is set at a desired voltage by a bias voltage setting section 26, as described later.

The combining circuit 30 subtracts and combines a direct current signal Ddc with respect to the signal Db including a low frequency band and a direct current component output from the low frequency extracting coil 23, and supplies the subtracted and combined signal obtained by the subtraction and combining to the other end of the bias applying coil 22.

Here, the combining circuit 30, as shown in FIG. 1, is obtained as a differential amplifier circuit using an operational amplifier 31a.

That is, in this combining circuit 30, for example, an input matching resistor 31b of 50Ω is connected between an inverted input end (+) serving as a first input end and a reference electrical potential point (earth line) of the operational amplifier 31a.

In addition, a feedback resistor 31c is connected between an output end of the operational amplifier 31a and an inverted input end (−) serving as a second input end.

In addition, an output matching resistor 31d of 50Ω, for example, is connected between the output end of the operational amplifier 31a and the bias applying coil 22.

In addition, a direct signal Ddc is designed to be input from the direct current voltage generator 25 via a direct current inputting resistor 31e having a resistance value equal to that of the feedback resistor 31c to the inverted input end (−) of the operational amplifier 31a.

An output resistance (internal resistance) of the direct current voltage generator 25 is small to an ignorable extent to the feedback resistor 31c and the direct current inputting resistor 31e, and is connected to a reference electrical potential point (earth line) from the viewpoint of an alternating current.

In the thus configured digital signal offset adjusting apparatus 20, if a compensation action of a frequency characteristic compensating circuit 35 described later is ignored, the operational amplifier 31a of the combining circuit 30 acts as a phased buffer of a gain 1 with respect to a low frequency band Db including an attenuation component caused by the output matching resistor 31d, assuming that the output terminal 20b is terminated at 50Ω.

In addition, the operational amplifier 31a of the combining circuit 30 acts as an inverted buffer (attenuator) having a gain 0.5 with respect to the direct current component Ddc of the voltage Vd output from the direct current voltage generator 25.

Namely, an output signal Vo of the combining circuit 30 is obtained as Vo=Db−Vd/2.

Here, assuming that the low frequency band Db is a sum of a direct current component Vdc and an alternating current component Vac, the output signal Vo is obtained as Vo=Vac+(Vdc−Vd/2).

This output signal Vo is input to the other end of the capacitor 21, i.e., to the output terminal 20b, via the bias applying coil 22.

Therefore, a digital signal D' to be output from the output terminal 20b is obtained as D'=Da+Vo=(Da+Vac)+(Vdc−Vd/2).

In the above formula, (Da+Vac) is an alternating current component, and (Vdc−Vd/2) is a direct current component. Thus, the output voltage Vd of the direct current voltage generator 25 is set to be variably adjusted by the voltage setting section 26 so that its direct current component (Vdc−Vd/2) is obtained as a desired value in the output terminal 20b, whereby a desired bias voltage can be applied to the digital signal D', that is, an offset of the digital signal D' can be adjusted at a desired value.

On the other hand, a frequency range of an alternating current component Vac of a high frequency band Da and a low frequency band Db is determined by a capacitance C of the capacitor 21 and an inductance L of the bias applying coil 22 and the low frequency extracting coil 23.

In this case, values of the capacitance C of the capacitor 21 and the inductance L of the bias applying coil 22 and the low frequency extracting coil 23 are set so that a lower limit frequency of a frequency range of the high frequency band Da and an upper frequency of the alternating current component Vac of the low frequency band Db are substantially identical to each other.

In addition, in this combining circuit 30, there is provided a frequency characteristic compensating circuit 35 for compensating for gain lowering in a specific frequency range between signal channels from the input terminal 20a to the output terminal 20b.

This frequency characteristic compensating circuit 35 is composed of a capacitor Cc and a resistor Rc connected in series between an inverted input end (−) and a reference electrical potential point (earth line) of the operational amplifier 31a of the combining circuit 30.

That is, the frequency characteristic compensating circuit 35 lowers impedance as its frequency increases with respect to an alternating circuit component Vac of a low frequency band Db, and lowers parallel combining impedance between the resistor Rc and the direct current inputting resistor 31e, thereby raising the gain of the operational amplifier 31a determined by a ratio between its parallel combining impedance and the feedback resistor 31c.

In addition, the frequency characteristic compensating circuit 35 has an action of increasing a gain of a frequency bandwidth (peaking effect) in the vicinity of the upper limit of the alternating current component Vac caused by a gain raise of the operational amplifier 31a and signal attenuation (gain lowering) caused by the inductance L of the bias applying coil 22 and the low frequency extracting coil 23.

Now, a simulation result of the above-described embodiment will be described here.

Figure 2:
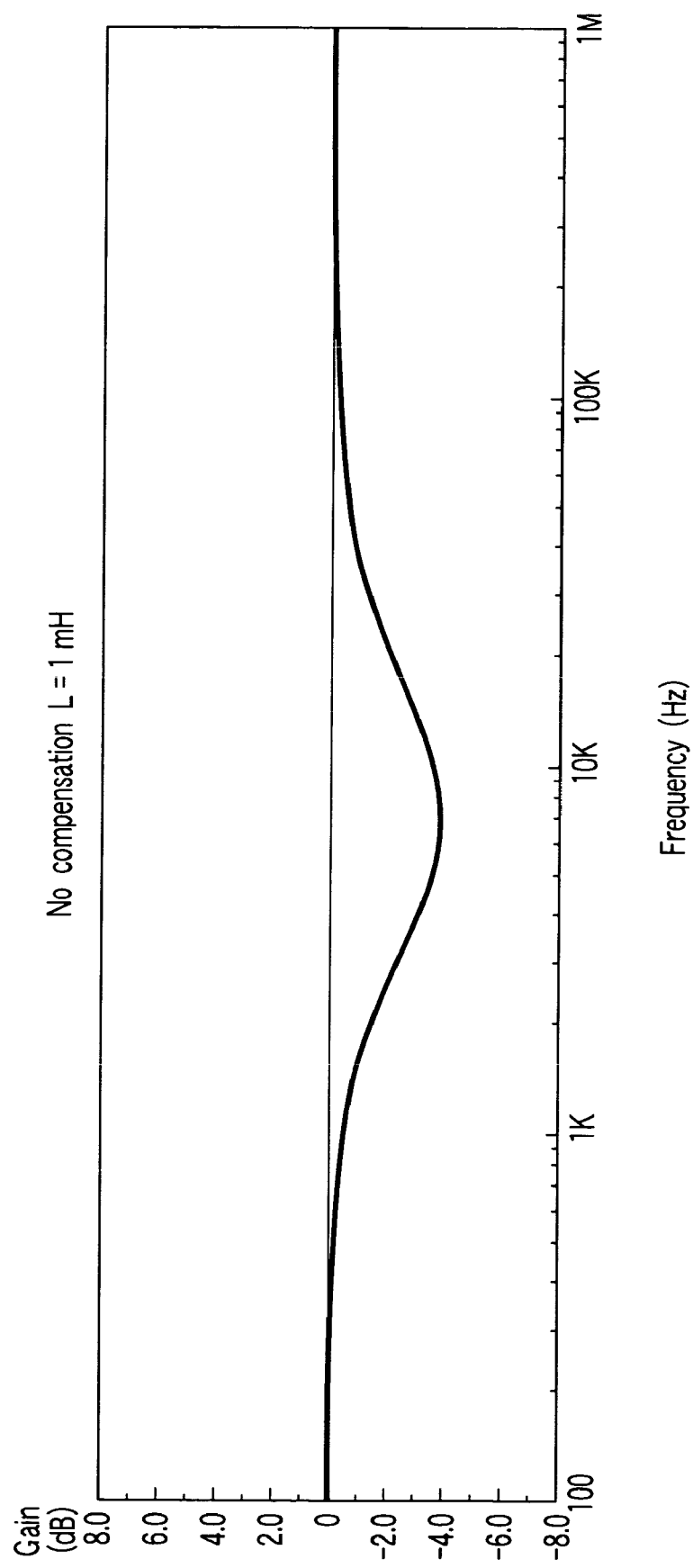
FIG. 2 is a view showing a transmission characteristic example between an input and an output without compensation using a frequency characteristic compensating circuit of the digital signal offset adjusting apparatus according to the first embodiment shown in FIG. 1.
Figure 3:
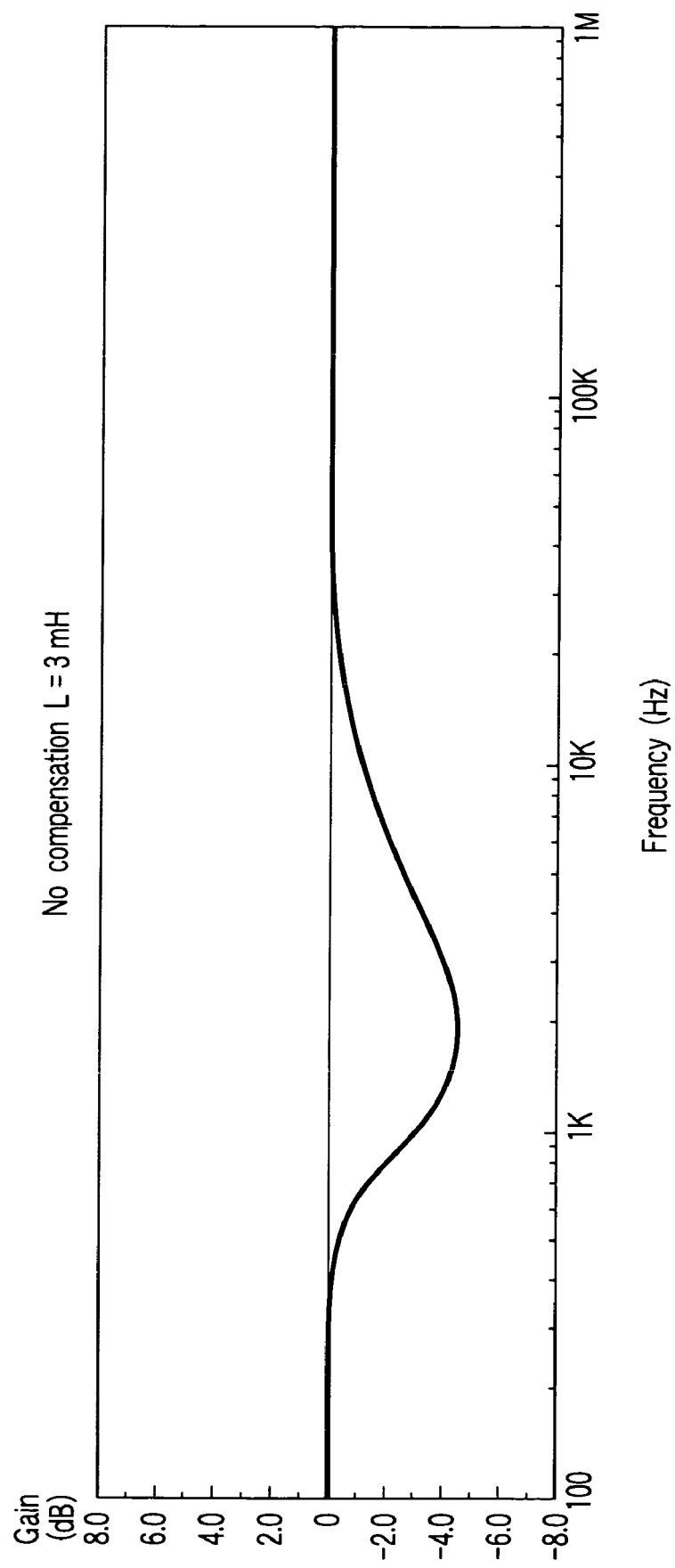
FIG. 3 is a view showing a transmission characteristic example between an input and an output without compensation using the frequency characteristic compensating circuit of the digital signal offset adjusting apparatus according to the first embodiment shown in FIG. 1.
Figure 4:
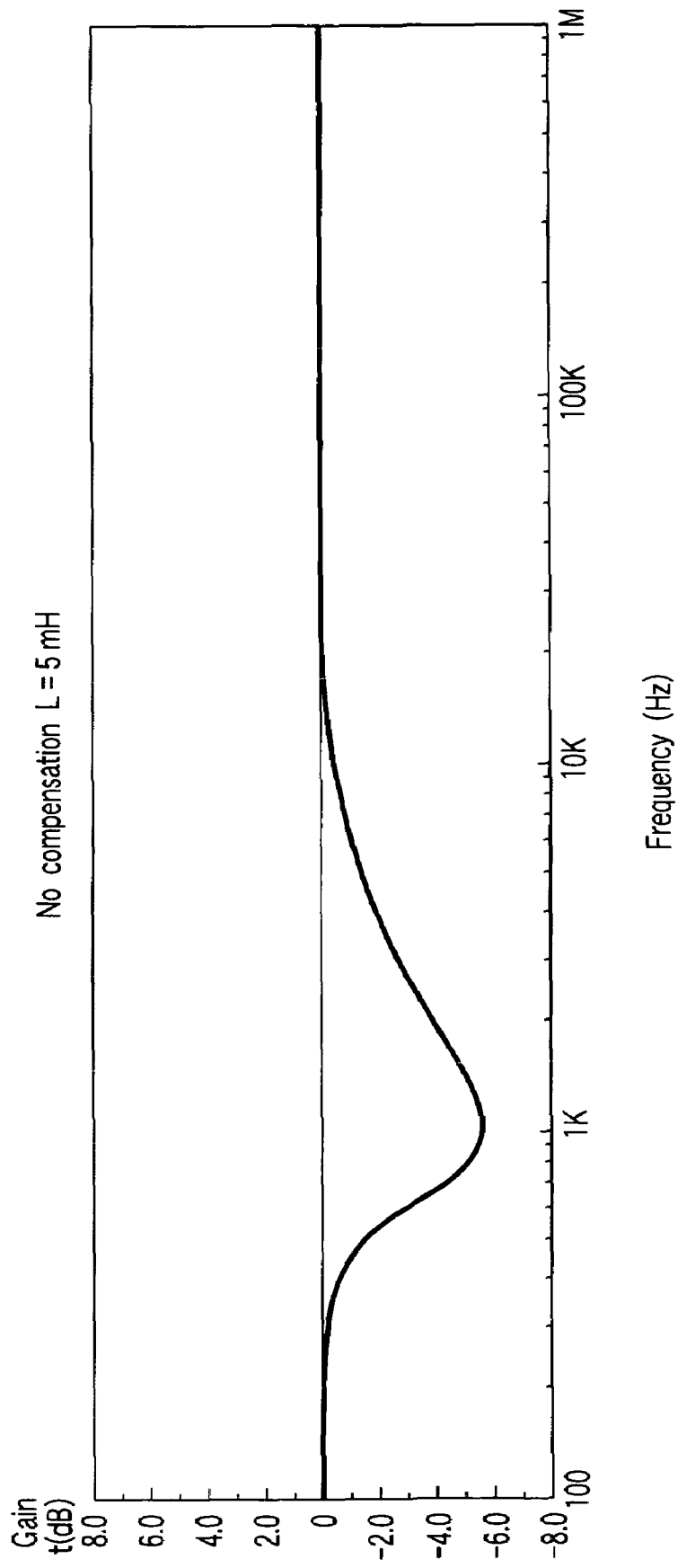
FIG. 4 is a view showing a transmission characteristic example between an input and an output without compensation using the frequency characteristic compensating circuit of the digital signal offset adjusting apparatus according to the first embodiment shown in FIG. 1.

FIGS. 2 to 4 each show a low area portion of input and output transmission characteristics when inductance L of each of the bias applying coil 22 and the low frequency extracting coil 23 are defined as 1 mH, 3 mH, and 5 mH in the case where the above-described frequency characteristic compensating circuit 35 is not included.

In FIGS. 2 to 4, a high area portion exceeding 1 MHz from among the input and output transmission characteristics is omitted because it is flat up to a desired bandwidth of a GHz band, for example.

In addition, the capacitance C of the capacitor 21 for use in obtaining input and output transmission characteristics of FIGS. 2 to 4 is 10 μF.

As is evident from these figures, FIGS. 2 to 4, in any inductance value also, a frequency region in which a gain is slightly lowered in a low area portion occurs.

The frequency region in which a gain is slightly lowered is shifted to a low area side with an increase of the inductances of the bias applying coil 22 and the low frequency extracting coil 23. Thus, it is estimated that this frequency lowering is caused by a parallel resonance action or the like between a direct current component of the inductances of the low frequency extracting coil 23 and the bias applying coil 22 and the capacitor 21.

In this case, the input matching resistor 31b having a low resistance is inserted, and thus a Q value of a parallel resonance circuit is low, thereby the gain lowering is slow.

Figure 5:
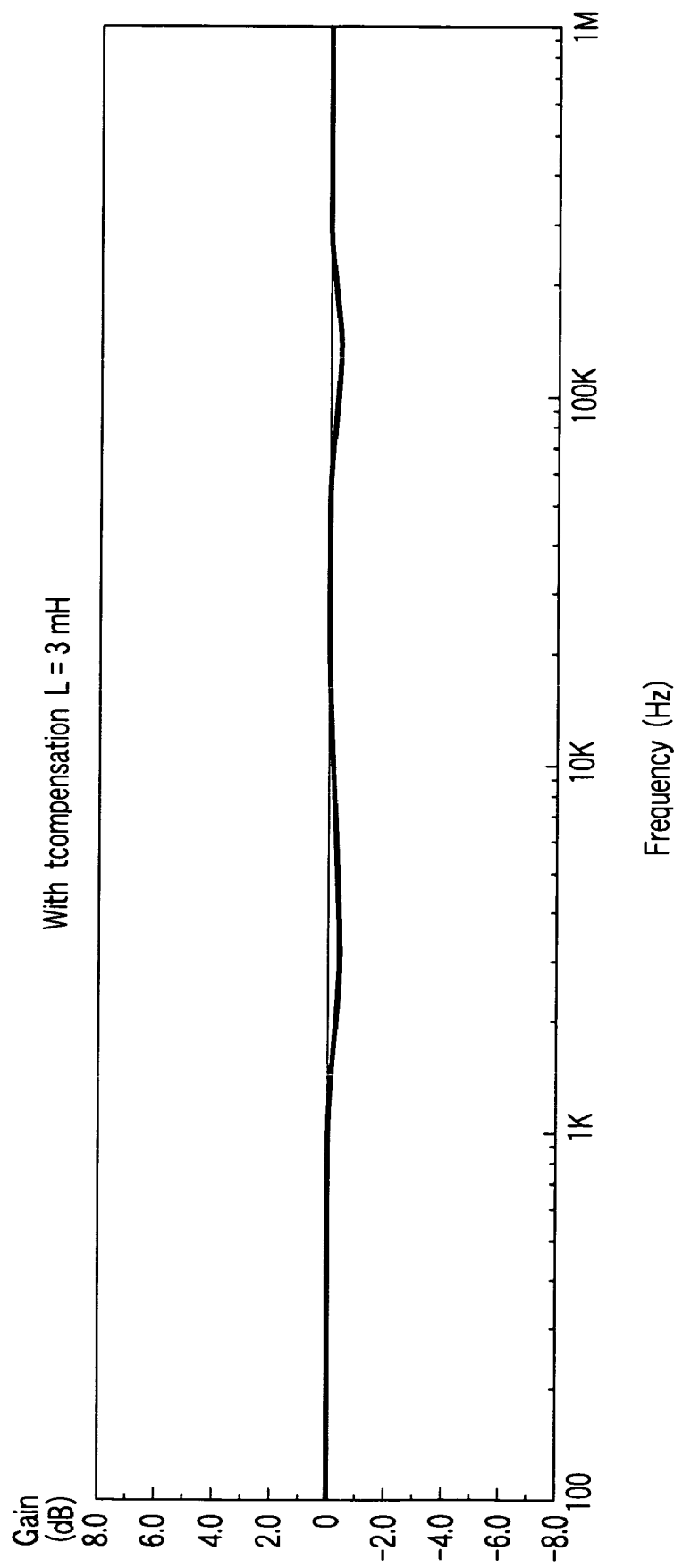
FIG. 5 is a view showing a transmission characteristic example between an input and an output with compensation using the frequency characteristic compensating circuit of the digital signal offset adjusting apparatus according to the first embodiment shown in FIG. 1.

Therefore, if the above-described gain lowing is compensated for by means of the frequency characteristic compensating circuit 35, as shown in FIG. 5, a flat input and output transmission characteristic can be obtained over a wider frequency range.

FIG. 5 shows input and output transmission characteristics between input and output terminals 20a and 20b when 0.12 μF is used as a capacitor Cs of the frequency characteristic compensating circuit 35 and a 47Ω compensating circuit 35 is used as a resistor Rc in order to increase an alternating current amplitude of the operational amplifier 31a in a gain lowering region of a characteristic (L=3 mH) shown in FIG. 3.

As is evident from comparison between this input and output transmission characteristic shown in FIG. 5 and input and output transmission characteristics without frequency characteristic compensation shown in FIG. 3, a gain lowering area as observed in a low area portion of FIGS. 2 to 4 is eliminated, and a characteristic close to be completely flat over a substantially full area can be obtained.

Therefore, in the digital signal offset adjusting apparatus 20 using this frequency characteristic compensating circuit 35, a high frequency band from a direct current component and a low frequency band to several GHz can be uniformly transmitted from among the frequency components included in an input digital signal, and signal transmission free from a waveform distortion can be carried out.

In addition, the combining circuit 30 of the above-described embodiment is composed of a differential amplifier circuit using a single operational amplifier 31a. Thus, circuit configuration is simple and can be downsized, and only one circuit is affected by a direct current offset error of a operational amplifier itself or its drift, and stable direct current bias supply can be carried out.

Second Embodiment

Figure 6:
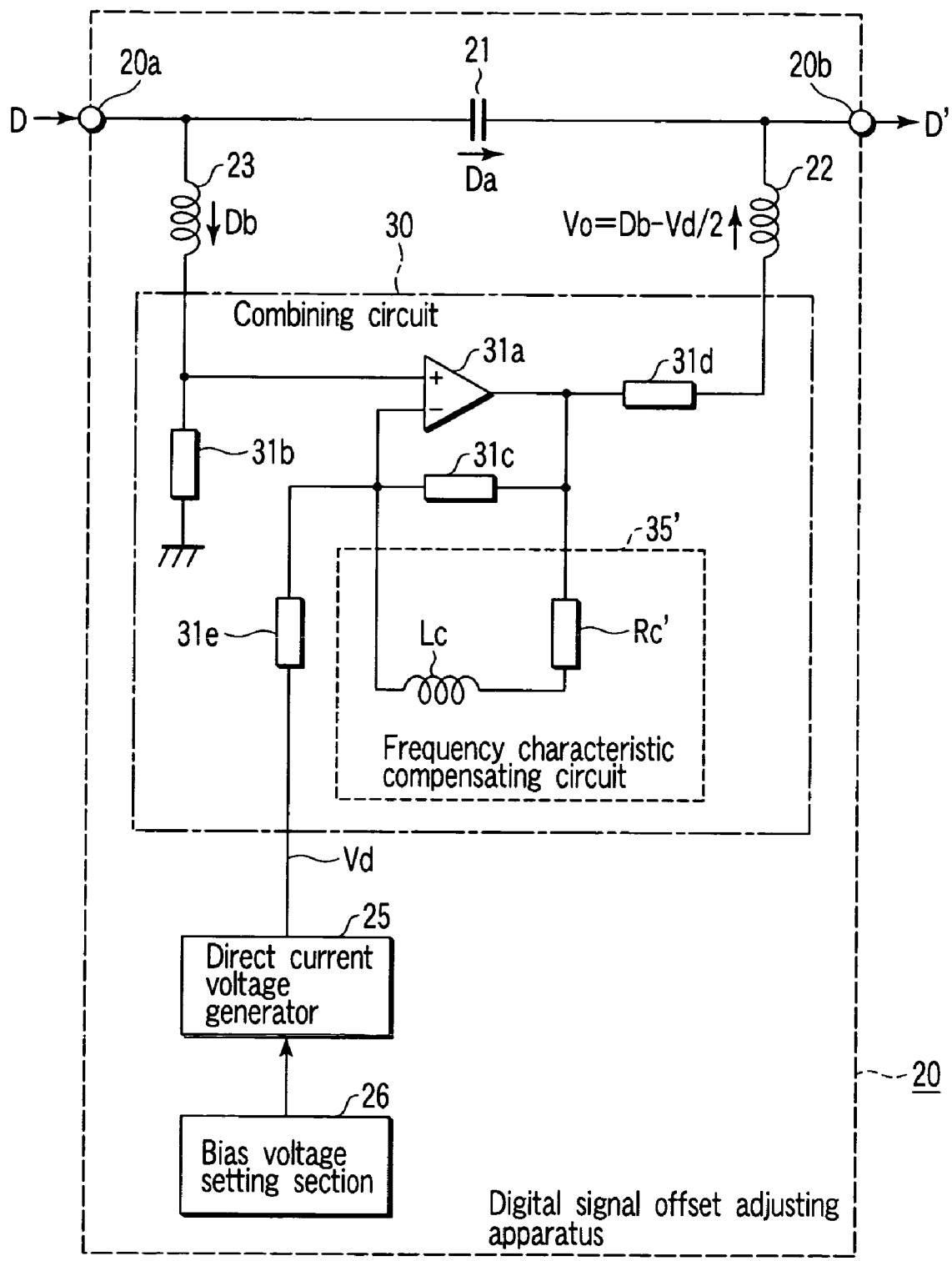
FIG. 6 is a connection diagram showing a configuration of a second embodiment of a digital signal offset adjusting apparatus according to the present invention.
Figure 7:
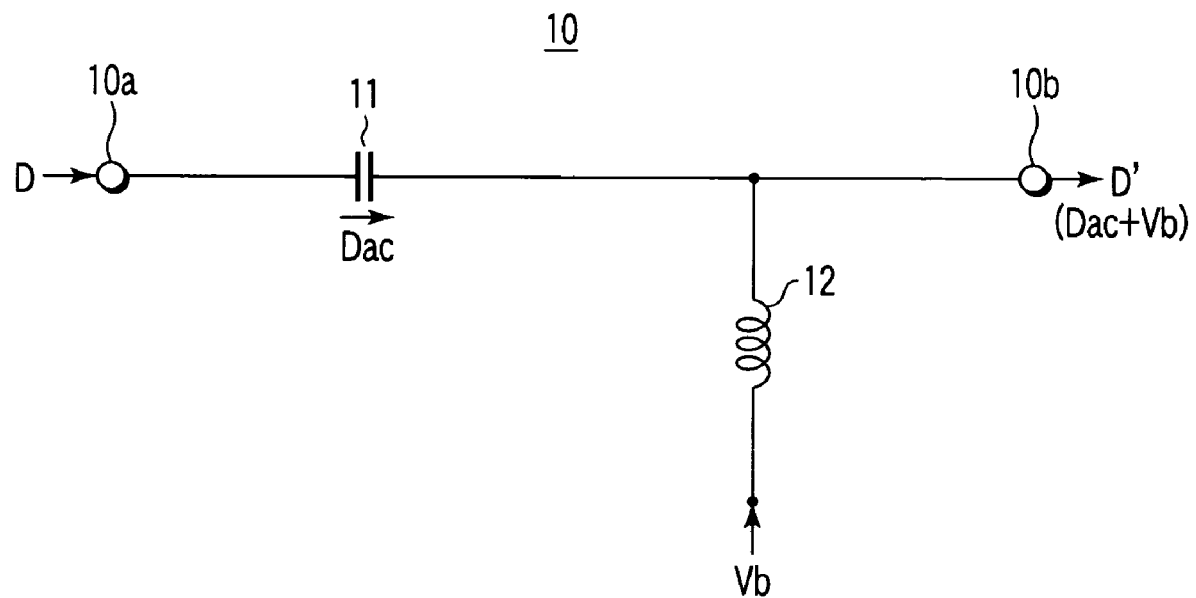
FIG. 7 is a connection diagram showing a configuration of a conventional digital signal offset adjusting apparatus.

FIG. 6 shows a circuit configuration of a digital signal offset adjusting apparatus 20 according to a second embodiment of the present invention.

In FIG. 6, with respect to the same circuit components as those of the digital signal offset adjusting apparatus 20 according to the first embodiment of the present invention shown in FIG. 1, a description thereof is omitted by using the same reference numerals, respectively.

That is, in the digital signal offset adjusting apparatus 20 according to the second embodiment of the present invention shown in FIG. 6, a configuration of a frequency characteristic compensating circuit 35' is different from that of the frequency characteristic compensating circuit 35 of the digital signal offset adjusting apparatus 20 according to the first embodiment shown in FIG. 1 described previously.

The above difference occurs in a case in which the frequency characteristic compensating circuit 35 of the digital signal offset adjuster 20 according to the first embodiment shown in FIG. 1 described previously is composed of a serial circuit between the capacitor Cc and the resistor Rc connected between an inverted input end (−) and a reference electrical potential point (earth line) of a operational amplifier 31a of a combining circuit 30.

In contrast, in the digital signal offset adjusting apparatus 20 according to the second embodiment shown in FIG. 6, the frequency characteristic compensating circuit 35' is composed of a serial circuit between a coil Lc and a resistor Rc' connected between an output terminal and an inverted input end (−) of the operational amplifier 31a.

In this case, a parallel combining resistance value between the feedback resistor 31c of the operational amplifier 31a and the resistor Rc of the frequency characteristic compensating circuit 35' may be set to be equal to a resistance value of a direct current inputting resistor 31e from a direct current voltage generator 25.

That is, the frequency characteristic compensating circuit 35', like the frequency characteristic compensating circuit 35 of FIG. 1, lowers impedance as its frequency increases with respect to an alternating current component Vac of a low frequency band Db, and lowers parallel combining impedance between the resistance Rc and the direct current input resistor 31e, thereby raising the gain of the operational amplifier 31a determined depending on a ratio between its parallel combining impedance and the feedback resistor 31c.

The thus configured frequency characteristic compensating circuit 35 of FIG. 6, like the frequency characteristic compensating circuit 35 of FIG. 1, has an action of increasing a gain of a frequency bandwidth (peaking effect) in the vicinity of an upper limit of an alternating current component Vac by a gain raise of the operational amplifier 31a and signal attenuation (gain lowering) caused by an inductance L of each of a bias applying coil 22 and a low frequency extracting coil 23.

Third Embodiment

Figure 8:
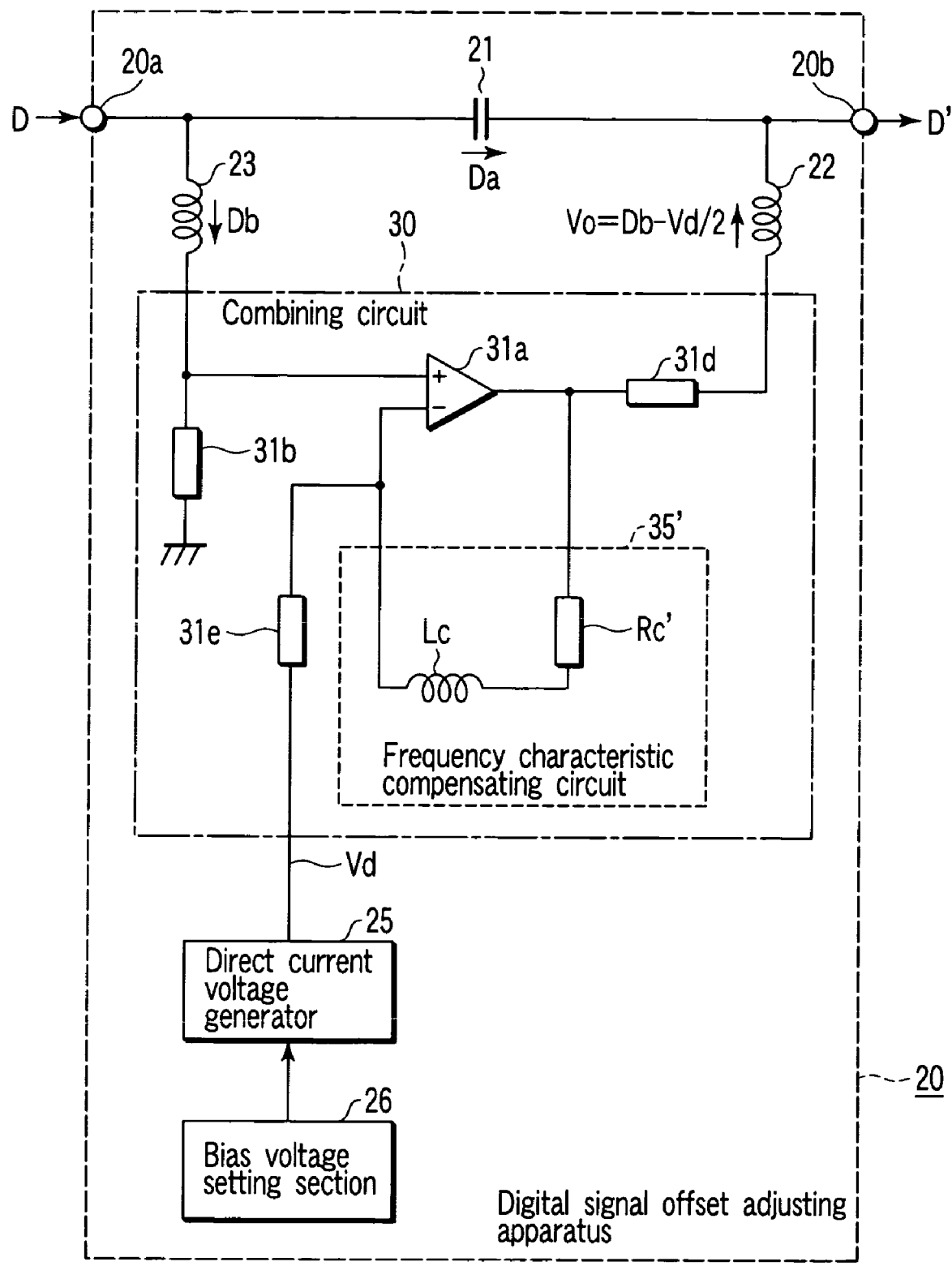
FIG. 8 is a connection diagram showing a configuration of a third embodiment of a digital signal offset adjusting apparatus according to the present invention.

FIG. 8 shows a circuit configuration of a digital signal offset adjusting apparatus 20 according to a third embodiment of the present invention.

In FIG. 8, with respect to the same circuit components as those of the digital signal offset adjusting apparatus 20 according to the second embodiment shown in FIG. 6, a description thereof is omitted by using the same reference numerals, respectively.

That is, in the digital signal offset adjusting apparatus 20 according to the third embodiment of the present invention shown in FIG. 8, a configuration of a frequency characteristic compensating circuit 35' is different from that of the frequency characteristic compensating circuit 35' of the digital signal offset adjusting apparatus 20 according to the second embodiment shown in FIG. 6 described previously.

In the digital signal offset adjusting apparatus 20 according to the second embodiment shown in FIG. 6 described previously, the above difference occurs in a case in which the frequency characteristic compensating circuit 35' is composed of a serial circuit between a coil Lc and a resistor Rc' connected between an output terminal and an inverted input end (−) of the operational amplifier 31a.

In contrast, in the digital signal offset adjusting apparatus 20 according to the third embodiment shown in FIG. 8, the frequency characteristic compensating circuit 35' is compatible with a feedback resistor 31c of the operational amplifier 31a by means of the resistor Rc' of the frequency characteristic compensating circuit 35' shown in FIG. 6 described previously, and the coil Lc is composed to be inserted in series between the resistor Rc' compatible with this feedback resistor 31c and the inverted input end (−) of the operational amplifier 31a.

In this case, the resistance value of the resistor Rc' of the frequency characteristic compensating circuit 35' compatible with the feedback resistor 31c of the operational amplifier 31a may be set to be equal to the resistance value of a direct current inputting resistor 31e from a direct current voltage generator 25.

That is, the frequency characteristic compensating circuit 35' of FIG. 8, like the frequency characteristic compensating circuit 35 of FIG. 1, lowers impedance as its frequency increases with respect to an alternating current component Vac of a low frequency band Db, and lowers parallel combining impedance between the resistance Rc and the direct current inputting resistor 31e, thereby raising the gain of the operational amplifier 31a determined depending on a ratio between its parallel combining impedance and the resistor Rc compatible with the feedback resistor.

The thus configured frequency characteristic compensating circuit 35' of FIG. 8, like the frequency characteristic compensating circuit 35 of FIG. 6, has a function of increasing a gain of a frequency bandwidth (peaking effect) in the vicinity of an upper limit of an alternating current component Vac by the gain raise of the operational amplifier 31a and signal attenuation (gain lowering) caused by an inductance L of each of a bias applying coil 22 and a low frequency extracting coil 23.

Fourth Embodiment

FIG. 9 shows a circuit configuration of a digital signal offset adjusting apparatus 20 according to a fourth embodiment of the present invention.

In FIG. 9, with respect to the same circuit constituent elements as those of the digital signal offset adjusting apparatus 20 according to the first embodiment shown in FIG. 1 described previously, a description thereof is omitted by using the same reference numerals, respectively.

That is, in the digital signal offset adjusting apparatus 20 according to the fourth embodiment of the present invention shown in FIG. 9, a configuration of a combining circuit 30 is different from that of the combining circuit 30 of the digital signal offset adjusting apparatus 20 according to the first embodiment shown in FIG. 1 described previously.

In the combining circuit 30 of the digital signal offset adjusting apparatus 20 according to the first embodiment shown in FIG. 1 described previously, the above difference occurs in a case in which a signal output from a low frequency extracting coil 23 and a direct current signal Ddc from a direct current voltage generator 25 are configured so as to be subtracted and combined by one operational amplifier 31a.

In contrast, in the digital signal offset adjusting apparatus 20 according to the fourth embodiment shown in FIG. 9, the combining circuit 30 is configured so as to add and combine the signal output from the low frequency extracting coil 23 and the direct current signal Ddc from the direct current voltage generator 25 by using a plurality of operational amplifiers.

Specifically, as shown in FIG. 9, the combining circuit 30 has: a first operational amplifier 40 in which an inverted input end (−) is connected to the other end of the low frequency extracting coil 23, and a first inverted and amplified signal obtained by inverting and amplifying a low frequency band and a direct current component of an input digital signal passed to the other end of the low frequency extracting coil 23 is output from an output end; a second operational amplifier 41 in which an inverted input end (−) is connected to an output end of the direct current voltage generator 25, and a second inverted and amplified signal obtained by inverting and amplifying the direct current bias output from the direct current voltage generator 25 is output from an output end; and a third operational amplifier 42 in which an inverted input end (−) is connected to each of the output ends of the first and second operational amplifiers 40 and 41, an added and combined signal obtained by adding and combining the first and second inverted and amplified signals is inverted and amplified, and is output to the other end of the bias applying coil 22 from the output end.

Here, each of the non-inverted input ends (+) of the first to third operational amplifiers 40, 41, and 42 is connected to a reference electrical potential point (earth line).

Feedback resistors 31c1, 31c2, and 31c3 are connected, respectively, between output ends and inverted input ends (−) of the first to third operational amplifiers 40, 41, and 42, and output matching resistors 31d1, 31d2, and 31d3 are connected, respectively, between each of the output ends of the first and second operational amplifiers 40 and 41 and the inverted input end (−) of the third operational amplifier 42 and between its output end and the bias applying coil 22.

In addition, the combining circuit 30 shown in FIG. 9 has first and second frequency characteristic compensating circuits 35a and 35b connected to each of the inverted input ends (−) of the first to third operational amplifiers 40 and 42, respectively, instead of the frequency characteristic compensating circuit 35 of FIG. 1, the circuits being adopted to compensate for a frequency characteristic so as to increase the gain of each of the first and third operational amplifiers 40 and 42 with a component having a higher frequency from among the low frequency bands of the input digital signal passed to the other end of the low frequency extracting coil 23.

These first and second frequency characteristic compensating circuits 35a and 35b, respectively, like the frequency characteristic compensating circuit 35 of the digital signal offset adjusting apparatus 20 according to the first embodiment shown in FIG. 1, are composed of a serial circuit between capacitors Cc1 and Cc2 and resistors Rc1 and Rc2 connected between each of the inverted input ends (−) and a reference electrical potential point (earth line) of each of the operational amplifiers 40 and 42 of the combining circuit 30.

That is, a signal output from the low frequency extracting coil 23 is inverted and amplified by means of the first operational amplifier 41; a direct current signal Ddc from the direct voltage generator 25 is inverted and amplified by means of the second operational amplifier 41; and a combining and adding signal of the first and second inverted and amplified signals from each of the output ends of the first and second operational amplifiers 40 and 41 is inverted and amplified by means of the third operational amplifier 42, whereby the added and combined signal of the first and second inverted and amplified signals can be output from the output end of the third operational amplifier 42 to the other end of the bias applying coil 22.

In this case, an output signal Vo of the combining circuit 30 of FIG. 9 is obtained as Vo=Db+Vd/2, assuming that the output signal conforms to a condition similar to that of FIG. 1 of the combing circuit 30.

Here, assuming that a low frequency band Db is a sum of a direct current component Vdc and an alternating current component Vac, the output signal Vo is obtained as Vo=Vac+(Vdc+Vd/2).

This output signal Vo is input to the other end of the capacitor 21, i.e., to an output terminal 20b, via the bias applying coil 22.

That is, a digital signal D' output from the output terminal 20b is obtained as D'=Da+Vo=(Da+Vac)+(Vdc+Vd/2).

In the above formula, (Da+Vac) is an alternating current component, and (Vdc+Vd/2) is a direct current component. Thus, an output voltage Vd of the direct current voltage generator 25 is set to be variably adjusted by a bias voltage setting section 26 so that its direct current component (Vdc+Vd/2) is obtained as a desired value in the output terminal 20b, whereby a desired bias voltage can be applied to the digital signal D', i.e., an offset of the digital signal D' can be adjusted to a desired value.

On the other hand, the frequency ranges of a high frequency band Da and the alternating current component Vac of the low frequency band Db are determined by a capacitance C of the capacitor 21 and an inductance L of the bias applying coil 22 and the low frequency extracting coil 23.

In this case, the values of the capacitance C of the capacitor 21 and the inductance L of each of the bias applying coil 22 and the low frequency extracting coil 23 are set so that the lower limit frequency in the frequency range of the high frequency band Da and the upper limit frequency of the alternating current component Vac of the low frequency band Db are substantially identical to each other.

In addition, the first and second frequency characteristic compensating circuits 35a and 35b provided in the combining circuit 30, respectively, like the frequency characteristic compensating circuit 35 shown in FIG. 1, are designed to compensate for frequency characteristics so as to increase the gain at a higher frequency thereof with respect to a signal output from the low frequency extracting coil 23 and a first inverted and amplified signal from the first operational amplifier 40 in the first and third operational amplifiers 40 and 42.

The thus configured first and second frequency characteristic circuits 35a and 35b of FIG. 9, respectively, like the frequency characteristic compensating circuit 35' of FIG. 6, has a function of increasing the gain of a frequency bandwidth (peaking effect) in the vicinity of an upper limit of the alternating current component Vac by the gain raise of each of the operational amplifiers 40 and 42 and signal attenuation (gain lowering) caused by the inductance L of each of the bias applying coil 22 and the low frequency extracting coil 23.

Fifth Embodiment

Figure 10:
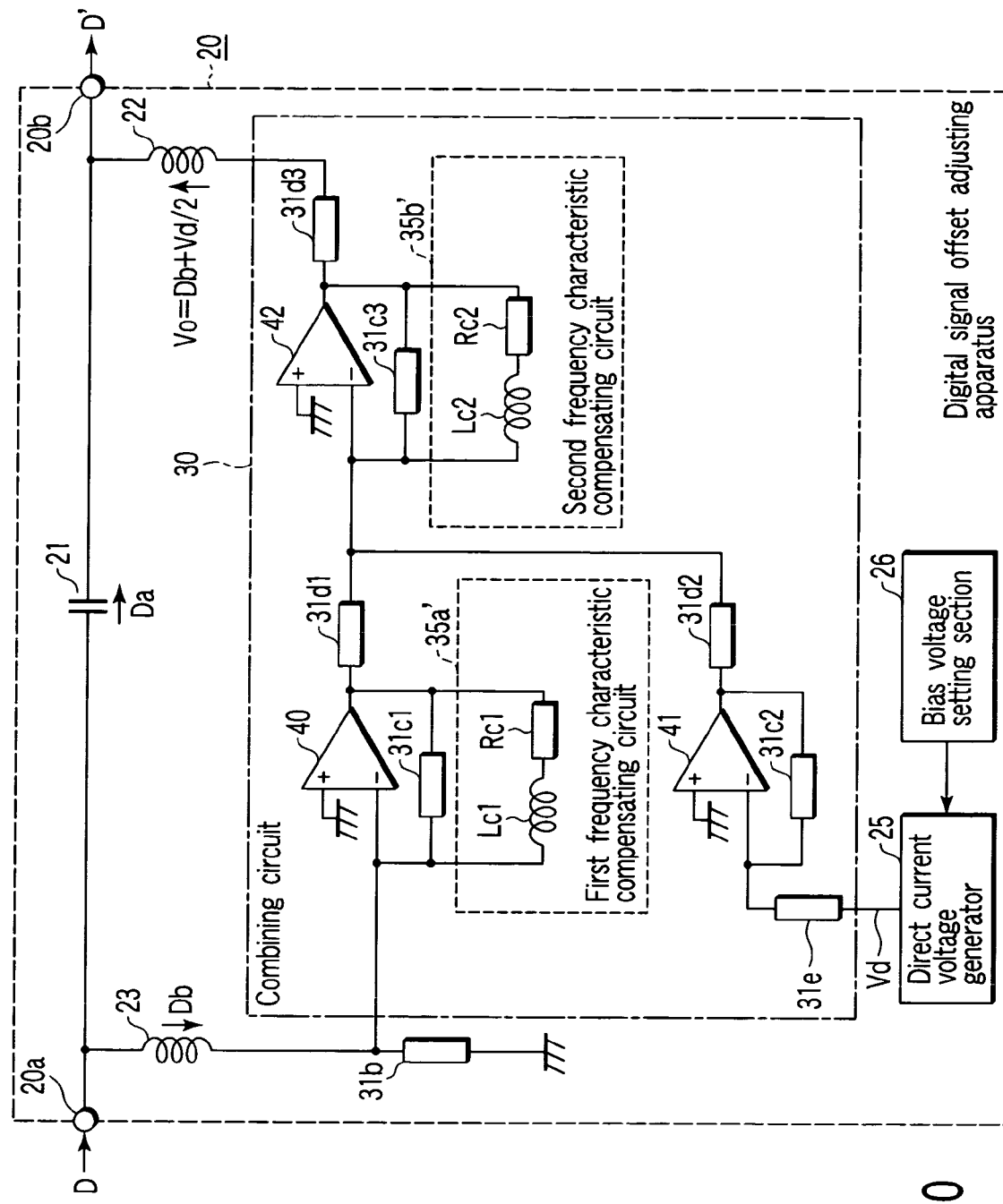
FIG. 10 is a connection diagram showing a configuration of a pulse pattern generator according to a fifth embodiment of the present invention.

FIG. 10 shows a circuit configuration of a digital signal offset adjusting apparatus 20 according to a fifth embodiment of the present embodiment.

In FIG. 10, with respect to the same circuit constituent elements as those of the digital signal offset adjusting apparatus 20 according to the fourth embodiment shown in FIG. 9 described previously, a description thereof is omitted by using the same reference numerals, respectively.

That is, in the digital signal offset adjusting apparatus 20 according to the fifth embodiment of the present invention shown in FIG. 10, a configuration of first and second frequency characteristic circuits 35a' and 35' is different from that of the first and second frequency characteristic circuits 35a and 35b of the digital signal offset adjusting apparatus 20 according to the fourth embodiment shown in FIG. 9 described previously.

The above difference occurs in a case in which the first and second frequency characteristic compensating circuits 35a and 35b of the digital signal offset adjusting apparatus 20 according to the fourth embodiment shown in FIG. 9 described previously are composed of a serial circuit of the capacitors Cc1 and Cc2 and resistors Rc1 and Rc2 connected between each of the inverted input ends (−) of the operational amplifiers 41 and 42 and a reference electrical potential point (earth line) in the first and third operational amplifiers 40 and 42 of the combining circuit 30, respectively.

In contrast, in the digital signal offset adjusting apparatus 20 according to the fifth embodiment shown in FIG. 10, the first and second frequency characteristic compensating circuits 35a' and 35b' are composed of a serial circuit between coils Lc1 and Lc2 and resistors Rc1 and Rc2 connected between an output end and an inverted input end (−) of each of the operational amplifiers 40 and 42, respectively, in the first and third operational amplifiers 40 and 42 of the combining circuit 30.

That is, the first and second frequency characteristic compensating circuits 35a' and 35b' of FIG. 10, respectively, like the frequency characteristic compensating circuit 35 shown in FIG. 1, are designed to compensate for frequency characteristics so as to increase a gain at a higher frequency thereof with respect to a signal output from the low frequency extracting coil 23 and a first inverted and amplified signal from the first operational amplifier 40 in the first and third operational amplifiers 40 and 42.

The thus configured first and second frequency characteristic compensating circuits 35a' and 35b' of FIG. 10, respectively, like the frequency characteristic compensating circuit 35' shown in FIG. 6, has a function of increasing the gain of a frequency bandwidth (peaking effect) in the vicinity of an upper limit of an alternating current component Vac by the gain raise of each of the operational amplifiers 40 and 42 and signal attenuation (gain lowering) caused by the inductances L of each of the bias applying coil 22 and the low frequency extracting coil 23.

Sixth Embodiment

FIG. 11 shows a circuit configuration of a digital signal offset adjusting apparatus 20 according to a sixth embodiment of the present invention.

In FIG. 11, with respect to the same circuit constituent elements as those of the digital signal offset adjusting apparatus 20 according to the fifth embodiment shown in FIG. 10 described previously, a description thereof is omitted by using the same reference numerals, respectively.

That is, in the digital signal offset adjusting apparatus 20 according to the sixth embodiment of the present invention shown in FIG. 11, a configuration of first and second frequency characteristic circuits 35a' and 35' is different from that of the first and second frequency characteristic circuits 35a' and 35b' of the digital signal offset adjusting apparatus 20 according to the fifth embodiment shown in FIG. 10 described previously.

The above difference occurs in a case in which, in the digital signal offset adjusting apparatus 20 according to the fifth embodiment shown in FIG. 10 described previously, the first and second frequency characteristic compensating circuits 35a' and 35b' are composed of a serial circuit between the coils Lc1 and Lc2 and the resistors Rc'1 and Rc'2 connected between an output end and an inverted input end (−) of each of the operational amplifiers 40 and 42, respectively, in the first and third operational amplifiers 40 and 42 of the combining circuit 30, respectively.

In contrast, in the digital signal offset adjusting apparatus 20 according to the sixth embodiment shown in FIG. 11, feedback resistors 31c1 and 31c3 of the operational amplifiers 40 and 42 are compatible with the resistors Rc1 and Rc2 of the first and second frequency characteristic compensating circuits 35a' and 35b' shown in FIG. 10 described previously, and the coils Lc1 and Lc2 are configured to be inserted in series between each of the resistors Rc1 and Rc2 and an inverted input end (−) of each of the operational amplifiers 40 and 42.

That is, the first and second frequency characteristic compensating circuits 30a' and 35b' of FIG. 11, respectively, like the frequency characteristic compensating circuit 35 shown in FIG. 1, are designed to compensate for frequency characteristics so as to increase the gain at a higher frequency thereof with respect to a signal output from the low frequency extracting coil 23 and a first inverted and amplified signal from the first operational amplifier 40 in the first and third operational amplifiers 40 and 42.

The thus configured first and second frequency characteristic compensating circuits 35a' and 35b' of FIG. 11, respectively, like the frequency characteristic compensating circuit 35' shown in FIG. 6, has a function of increasing the gain of a frequency bandwidth (peaking effect) in the vicinity of an upper limit of an alternating current component Vac by the gain raise of each of the operational amplifiers 40 and 42 and signal attenuation (gain lowering) caused by the inductances L of each of the bias applying coil 22 and the low frequency extracting coil 23.

Therefore, according to the first to sixth embodiments of the present invention as described above, there can be provided a digital signal offset adjusting apparatus capable of solving the problems which remain unsolved in the conventional technique and correctly transmitting a wideband digital signal including a low frequency band to a high frequency band ranging from a band of several hundred of Hz to GHz, for example, without generating a waveform distortion.

Seventh Embodiment

FIG. 12 shows a circuit configuration of a pulse pattern generator 100 of a seventh embodiment according to the present invention using the digital signal offset adjusting apparatus 20 according to the first embodiment shown in FIG. 1 described previously.

This pulse pattern generator 100 of the seventh embodiment according to the present invention shown in FIG. 12 is basically composed of: a digital signal output section 101 for outputting a digital signal having a wideband frequency characteristic including a low frequency band, a direct current component, and a high frequency band, a digital signal of a desired pulse pattern including a data pattern such that identical bit data are continuous; and a digital signal offset adjusting apparatus 20 connected to the digital signal output section 101.

In addition, the digital signal offset adjusting apparatus 20 has: an input terminal 20a to which a digital signal of a desired pulse pattern having a wideband frequency characteristic including a low frequency band, a direct current component, and a high frequency band output from the digital signal output section 101 is input as an input digital signal; a direct current voltage generator 25 for outputting a desired direct current bias voltage; an output terminal 20b for outputting an output digital signal obtained when a direct current bias voltage output from the direct current voltage generator 25 has been applied to a low frequency band, a direct current component, and a high frequency band of an input digital signal input to the input terminal 20a; a capacitor 21 connected between the input terminal 20a and the output terminal 20b, the capacitor passing a high frequency band of an input digital signal input to the input terminal 20a to the output terminal; a first coil 23 whose one end is connected to the input terminal 20a, the first coil passing a low frequency band and a direct current component of an input digital signal to another end; a second coil 22 whose one end is connected to the output terminal 20b; a operational amplifier 31a, a first input end of which is connected to the other end of the first coil 23, a second input end of which is connected to the direct current voltage generator 25, and an output end of which is connected to another end of the second coil 22, the operational amplifier outputting a composite signal obtained by combining a low frequency band and a direct current component of an input digital signal passed to the other end of the first coil 23 input to the first and second input ends and a direct current bias voltage output from the direct current voltage generator 25 to the output terminal 20b via the other end of the second coil 22 from an output end; and a frequency characteristic compensating circuit 35 connected between the reference electrical potential point (earth line) and the second input end of the operational amplifier 31a or between the second input end and the output end, the compensating circuit being adopted to compensate for a frequency characteristic so that the gain of the operational amplifier 31a increases with a component having a higher frequency from among the low frequency bands of the input digital signal passed to the other end of the first coil.

Specifically, as shown in FIG. 12, this pulse pattern generator 100 according to the seventh embodiment is composed of: a digital signal output section 101; a pulse pattern specifying section 102 for specifying a pulse pattern of a digital signal output by this digital signal output section 101; and the digital signal offset adjusting apparatus 20 according to the first embodiment shown in FIG. 1 described previously for adjusting an offset of the digital signal output by the digital signal output section 101.

In FIG. 12, with respect to the same circuit constituent elements as those of the digital signal offset adjusting apparatus 20 according to the first embodiment shown in FIG. 1 described previously, a description thereof is omitted by using the same reference numerals, respectively.

The digital signal output section 101 shown in FIG. 12 is configured so as to output digital signals of various patterns such as a program pattern of 8 Mbit length (corresponding to STM-64/STM-192 6 frames), a PRBS pattern from $2^7-1$ to $2^{31}-1$, an alternate pattern, and a zero inserting pattern represented by a digital signal of a predetermined random pattern having a wideband frequency characteristic including a low frequency band, a direct current component, and a high frequency band as a digital signal used in the case of carrying out testing or the like of a variety of devices for use in a communication system as a digital signal output section incorporated in an MP1761C pulse pattern generator or the like available from Anritsu Co., Ltd, for example, according to the pulse pattern specified by the pulse pattern specifying section 102.

To the digital signal offset adjusting apparatus 20 connected to an output end of this digital signal output section 101, a digital signal of a desired pulse pattern having a wideband frequency characteristic including the low frequency band, direct current component, and high frequency band output in response to specification of a pulse pattern from the digital signal output section 101 by means of the pulse pattern specifying section 102 is input as an input digital signal.

That is, the pulse pattern generator 100 according to the seventh embodiment of the present invention shown in FIG. 12 is capable of transmitting without generating a waveform distortion a wideband digital signal including a direct component and a low frequency band to a high frequency band ranging from several hundred Hz to GHz band, for example, like a case of the digital signal offset adjusting apparatus 20 according to the first embodiment described previously, by a digital signal offset adjusting apparatus 20 in which a digital signal of a desired pulse pattern having a wideband frequency component including the low frequency band, direct current component, and high frequency band output from the digital signal output section 101 in response to specification of a pulse pattern by the pulse pattern specifying section 102 is input as an input digital signal to the input terminal 20a. Thus, a test of various devices for use in a digital communication system can be properly carried out.

Eighth Embodiment

Figure 13:
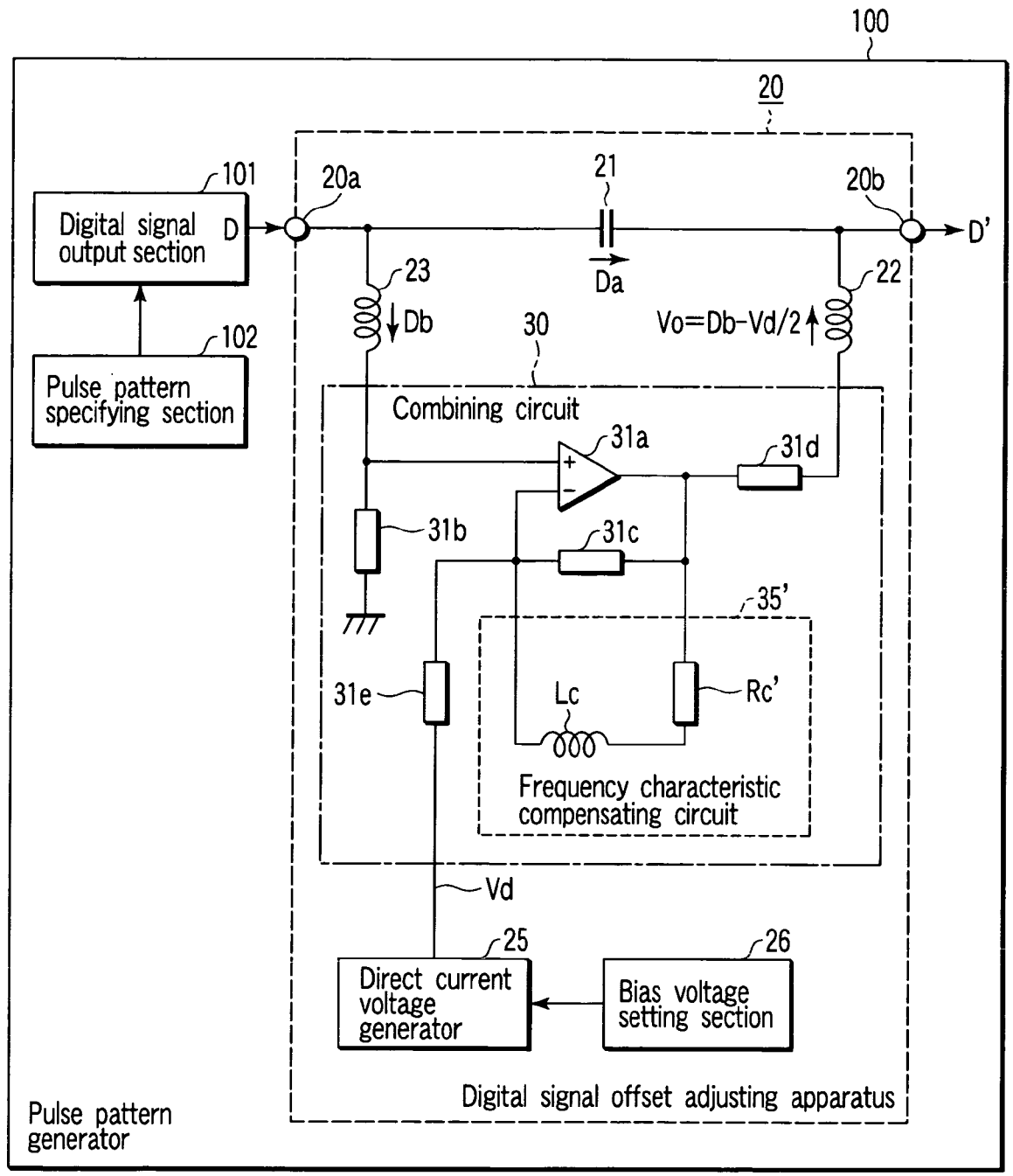
FIG. 13 is a connection diagram showing a configuration of a pulse pattern generator according to an eighth embodiment of the present invention.

FIG. 13 shows a circuit configuration of a pulse pattern generator 100 of an eighth embodiment according to the present invention using the digital signal offset adjusting apparatus 20 according to the second embodiment shown in FIG. 6 described previously.

In FIG. 13, with respect to the same circuit components as those of the digital signal offset adjusting apparatus 20 according to the second embodiment shown in FIG. 6 and the pulse pattern generator 100 according to the seventh embodiment shown in FIG. 12, a description thereof is omitted by using the same reference numerals, respectively.

By the pulse pattern generator 100 according to the eighth embodiment of the present invention shown in FIG. 13 as well, like the pulse pattern generator 100 according to the seventh embodiment of the present invention shown in FIG. 12 described previously, a wideband digital signal including a direct current component and a low frequency band to a high frequency band ranging from several hundred Hz to GHz band, for example, can be correctly transmitted without generating a waveform distortion, as is the case with the digital signal offset adjusting apparatus 20 according to the second embodiment described previously, by means of the digital signal offset adjusting apparatus 20 in which a digital signal of a desired pulse pattern having a wideband frequency characteristic including the low frequency band, direct current component, and high frequency band output from the digital signal output section 101 in response to specification of a pulse pattern by the pulse pattern specifying section 102 is input as an input digital signal to the input terminal 20*a*. Thus, a test of various devices for use in a digital communication system can be properly carried out.

Ninth Embodiment

FIG. 14 shows a circuit configuration of a pulse pattern generator 100 of a ninth embodiment according to the present invention using the digital signal offset adjusting apparatus 20 according to the third embodiment shown in FIG. 8 described previously.

In FIG. 14, with respect to the same circuit components as those of the digital signal offset adjusting apparatus 20 according to the third embodiment shown in FIG. 8 and the pulse pattern generator 100 according to the seventh embodiment shown in FIG. 12, a description thereof is omitted by using the same reference numerals, respectively.

By the pulse pattern generator 100 according to the ninth embodiment of the present invention shown in FIG. 14 as well, like the pulse pattern generator 100 according to the seventh embodiment of the present invention shown in FIG. 12 described previously, a wideband digital signal including a direct current component and a low frequency band to a high frequency band ranging from several hundred Hz to GHz band, for example, can be correctly transmitted without generating a waveform distortion, as is the case with the digital signal offset adjusting apparatus 20 according to the third embodiment described previously, by means of the digital signal offset adjusting apparatus 20 in which a digital signal of a desired pulse pattern having a wideband frequency characteristic including the low frequency band, direct current component, and high frequency band output from the digital signal output section 101 in response to specification of a pulse pattern by the pulse pattern specifying section 102 is input as an input digital signal to the input terminal 20*a*. Thus, a test of various devices for use in a digital communication system can be properly carried out.

Tenth Embodiment

Figure 15:
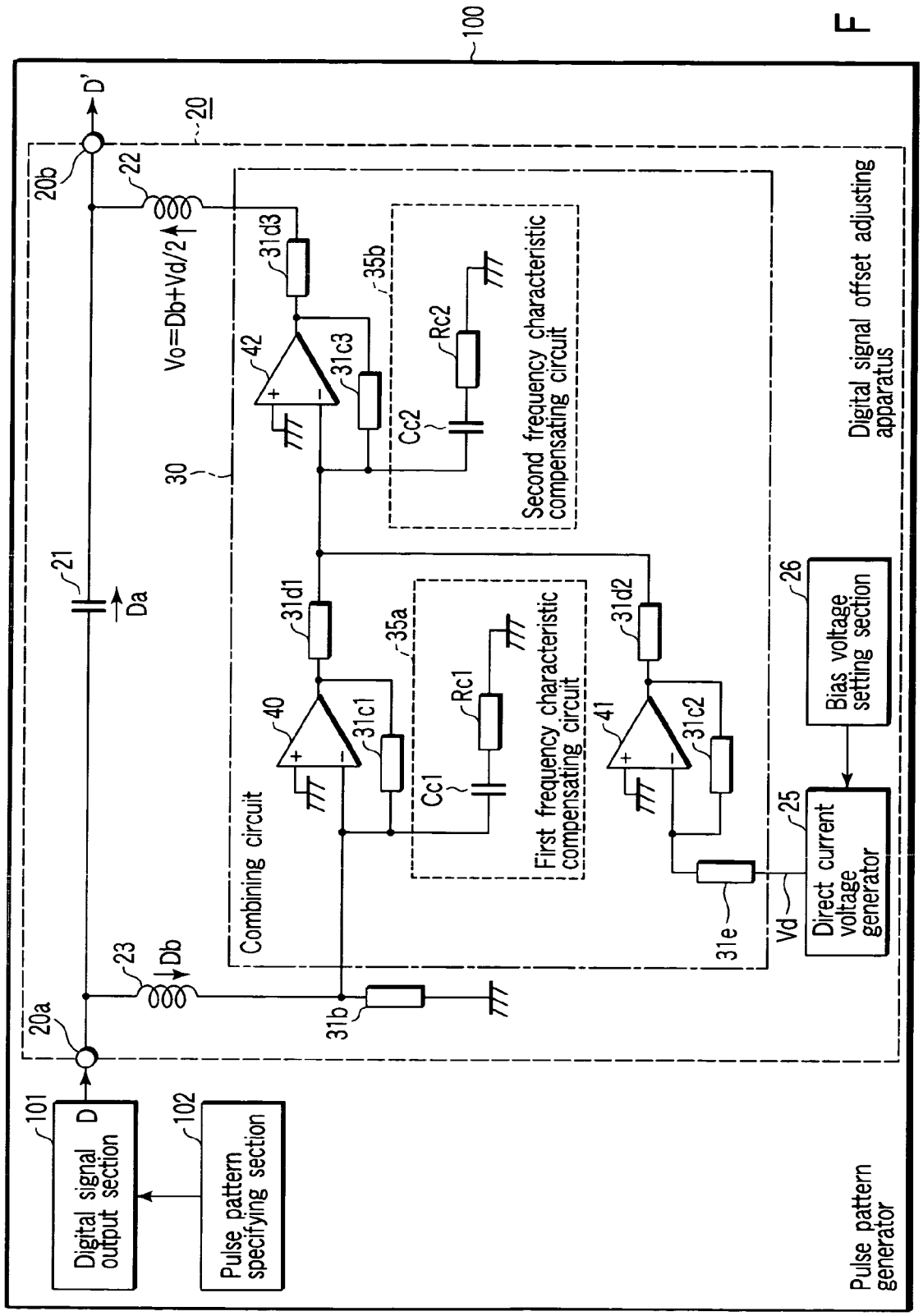
FIG. 15 is a connection diagram showing a configuration of a pulse pattern generator according to a tenth embodiment of the present invention.

FIG. 15 shows a circuit configuration of a pulse pattern generator 100 of a tenth embodiment according to the present invention using the digital signal offset adjusting apparatus 20 according to the fourth embodiment shown in FIG. 9 described previously.

In FIG. 15, with respect to the same circuit components as those of the digital signal offset adjusting apparatus 20 according to the fourth embodiment shown in FIG. 9 and the pulse pattern generator 100 according to the seventh embodiment shown in FIG. 12, a description thereof is omitted by using the same reference numerals, respectively.

By the pulse pattern generator 100 according to the tenth embodiment of the present invention shown in FIG. 15 as well, like the pulse pattern generator 100 according to the seventh embodiment of the present invention shown in FIG. 12 described previously, a wideband digital signal including a direct current component and a low frequency band to a high frequency band ranging from several hundred Hz to GHz band, for example, can be correctly transmitted without generating a waveform distortion, as is the case with the digital signal offset adjusting apparatus 20 according to the fourth embodiment described previously, by means of the digital signal offset adjusting apparatus 20 in which a digital signal of a desired pulse pattern having a wideband frequency characteristic including the low frequency band, direct current component, and high frequency band output from the digital signal output section 101 in response to specification of a pulse pattern by the pulse pattern specifying section 102 is input as an input digital signal to the input terminal 20*a*. Thus, a test of various devices for use in a digital communication system can be properly carried out.

Eleventh Embodiment

Figure 16:
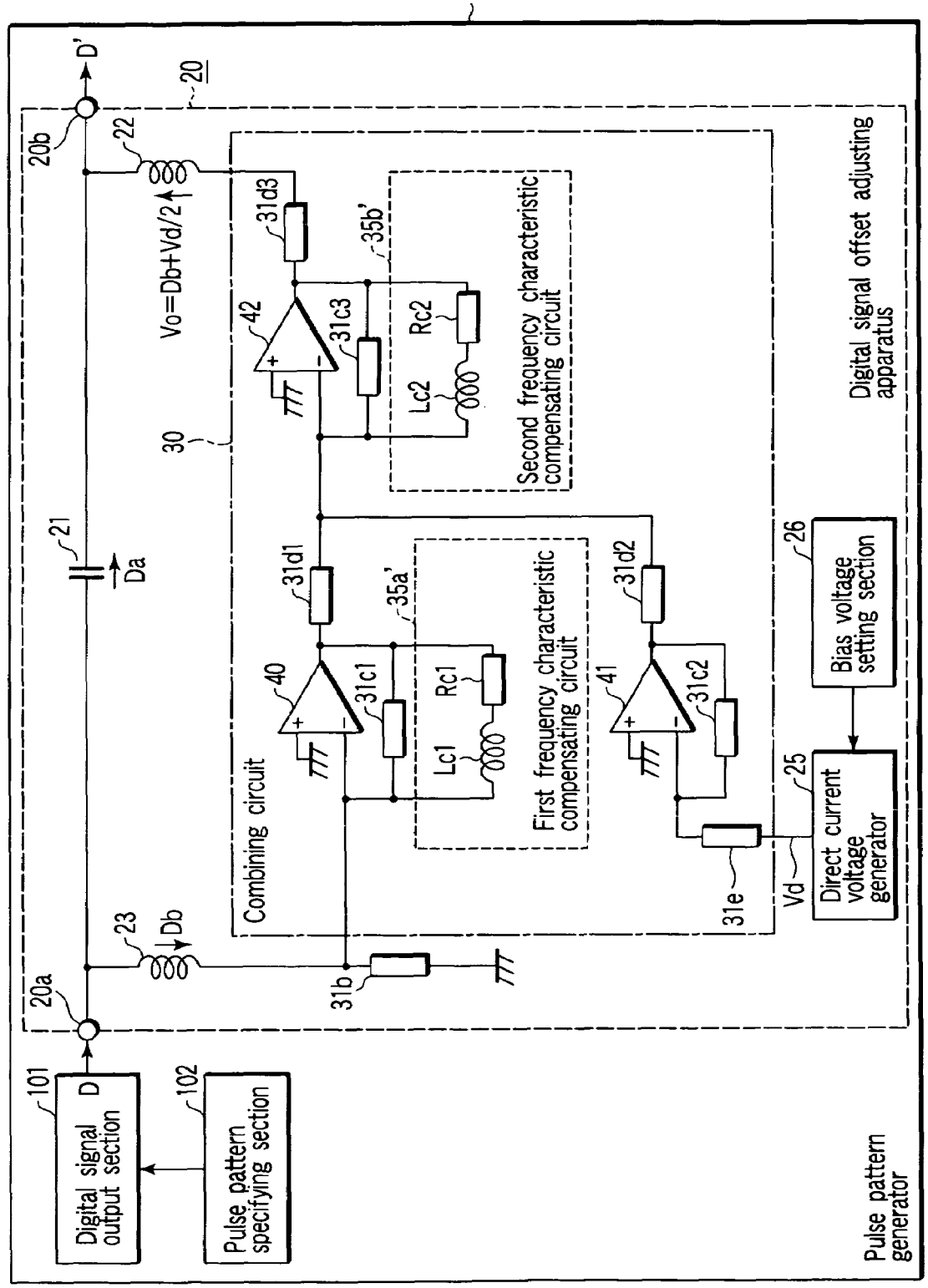
FIG. 16 is a connection diagram showing a configuration of a pulse pattern generator according to an eleventh embodiment of the present invention.

FIG. 16 shows a circuit configuration of a pulse pattern generator 100 of an eleventh embodiment according to the present invention using the digital signal offset adjusting apparatus 20 according to the fifth embodiment shown in FIG. 10 described previously.

In FIG. 16, with respect to the same circuit components as those of the digital signal offset adjusting apparatus 20 according to the fifth embodiment shown in FIG. 10 and the pulse pattern generator 100 according to the seventh embodiment shown in FIG. 12, a description thereof is omitted by using the same reference numerals, respectively.

By the pulse pattern generator 100 according to the eleventh embodiment of the present invention shown in FIG. 16 as well, like the pulse pattern generator 100 according to the seventh embodiment of the present invention shown in FIG. 12 described previously, a wideband digital signal including a direct current component and a low frequency band to a high frequency band ranging from several hundred Hz to GHz band, for example, can be correctly transmitted without generating a waveform distortion, as is the case with the digital signal offset adjusting apparatus 20 according to the fifth embodiment described previously, by means of the digital signal offset adjusting apparatus 20 in which a digital signal of a desired pulse pattern having a wideband frequency characteristic including the low frequency band, direct current component, and high frequency band output from the digital signal output section 101 in response to specification of a pulse pattern by the pulse pattern specifying section 102 is input as an input digital signal to the input terminal 20*a*. Thus, a test of various devices for use in a digital communication system can be properly carried out.

Twelfth Embodiment

Figure 17:
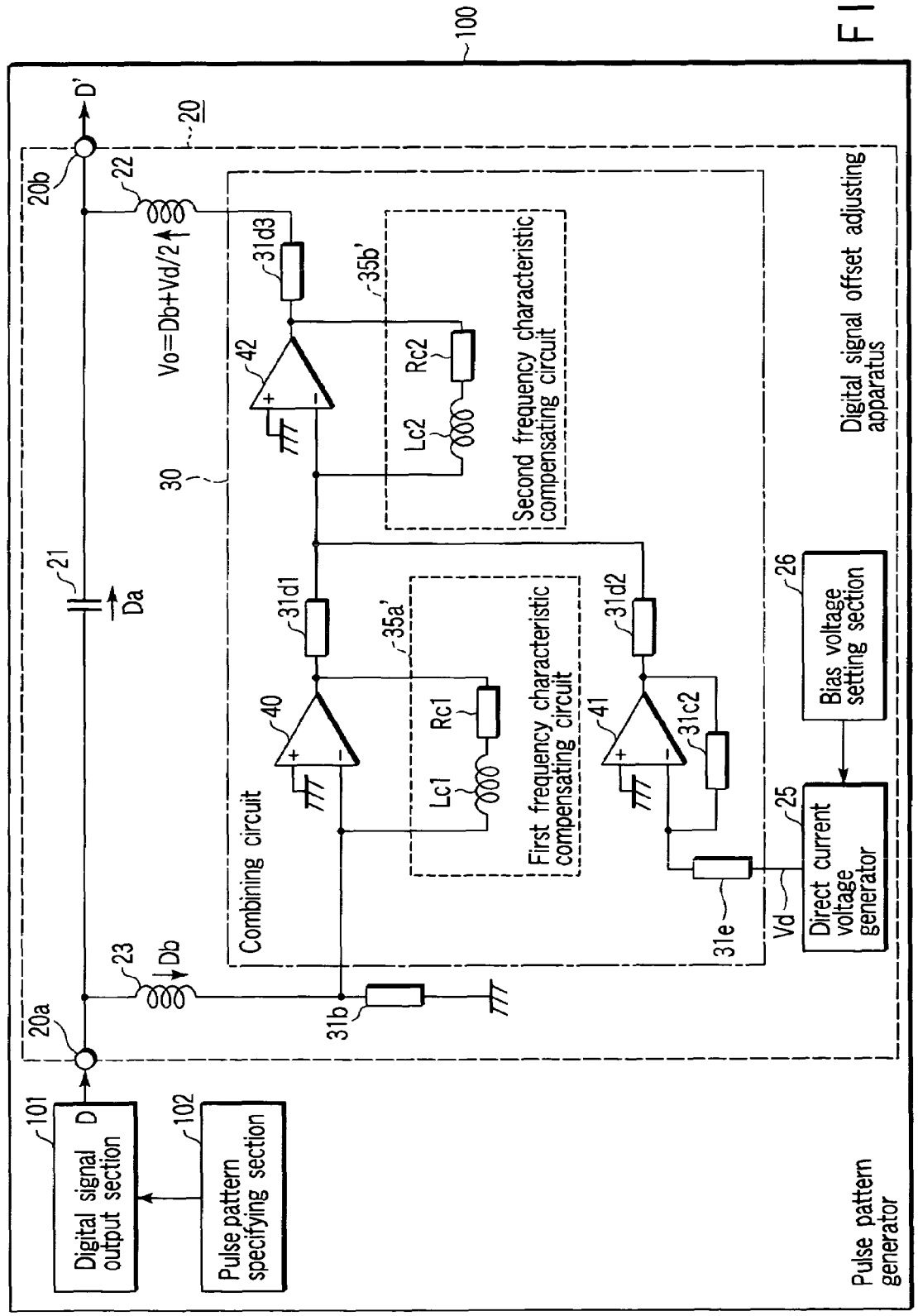
FIG. 17 is a connection diagram showing a configuration of a pulse pattern generator according to a twelfth embodiment of the present invention.

FIG. 17 shows a circuit configuration of a pulse pattern generator 100 of a twelfth embodiment according to the present invention using the digital signal offset adjusting apparatus 20 according to the sixth embodiment shown in FIG. 11 described previously.

In FIG. 17, with respect to the same circuit components as those of the digital signal offset adjusting apparatus 20 according to the sixth embodiment shown in FIG. 11 and the pulse pattern generator 100 according to the seventh embodiment shown in FIG. 12, a description thereof is omitted by using the same reference numerals, respectively.

By the pulse pattern generator 100 according to the twelfth embodiment of the present invention shown in FIG. 17 as well, like the pulse pattern generator 100 according to the seventh embodiment of the present invention shown in FIG. 12 described previously, a wideband digital signal including a direct current component and a low frequency band to a high frequency band ranging from several hundred Hz to GHz band, for example, can be correctly transmitted without generating a waveform distortion, as is the case with the digital signal offset adjusting apparatus 20 according to the sixth embodiment described previously, by means of the digital signal offset adjusting apparatus 20 in which a digital signal of a desired pulse pattern having a wideband frequency characteristic including the low frequency band, direct current component, and high frequency band output from the digital signal output section 101 in response to specification of a pulse pattern by the pulse pattern specifying section 102 is input as an input digital signal to the input terminal 20a. Thus, a test of various devices for use in a digital communication system can be properly carried out.

Therefore, according to the pulse pattern generators 100 according to the seventh to twelfth embodiments of the present invention using the digital signal offset adjusting apparatus 20 according to the first to sixth embodiments as described above, there can be provided a pulse pattern generator which solves the problems which remain unsolved in the conventional technique, for example, and which can transmit a wideband digital signal including a low frequency band to a high frequency band ranging from several hundred Hz to GHz band without generating a waveform distortion and can properly carry out testing or the like of a variety of devices.

INDUSTRIAL APPLICABILITY

As described above, according to a digital signal offset adjusting apparatus of the present invention, there is compensated for gain lowering in a specific frequency region when a low frequency band and a direct current component which cannot pass through a capacitor are sampled by means of a low frequency extracting coil to be combined with a bias direct current signal, and the combined signals are supplied to an output terminal via a bias applying coil from among the frequency components included in a digital signal input to an input terminal as a digital signal which carries out testing or the like of a variety of devices for use in a digital communication system. Thus, unlike a conventional technique, there is attained an advantageous effect that frequency components of input digital signals can be uniformly transmitted to an output terminal without using a capacitor having a large capacitance or a coil having a large inductance, making it possible to transmit a wideband waveform with a small distortion and an entire digital signal offset adjusting apparatus can be reduced in cost.

In addition, according to a pulse pattern generator using the digital signal offset adjusting apparatus as described above, there is attained an advantageous effect that testing or the like of a variety of devices for use in a digital communication system can be properly carried out.

Therefore, a digital signal offset adjusting apparatus and a pulse pattern generator using the adjusting apparatus according to the present invention can be useful as a digital signal offset adjusting apparatus and a pulse pattern generator using the adjusting apparatus adopted to test a communication device or the like.

The invention claimed is:

1. A digital signal offset adjusting apparatus comprising:
an input terminal to which an input digital signal having a wideband frequency characteristic including a low frequency band, a direct current component, and a high frequency band is input;
a direct current voltage generator which outputs a desired direct current bias voltage;
an output terminal to output an output digital signal obtained by applying the direct current bias voltage output from the direct current voltage generator to the low frequency band, the direct current component, and the high frequency band of the input digital signal input to the input terminal;
a capacitor which is connected between the input terminal and the output terminal and which causes the output terminal to pass through the high frequency band of the input digital signal input to the input terminal;
a first coil, one end of which is connected to the input terminal, and which passes the low frequency band and the direct current component of the input digital signal to another end;
a second coil, one end of which is connected to the output terminal;
an operational amplifier, a first input end of which is connected to the other end of the first coil, a second input end of which is connected to the direct current voltage generator, an output end of which is connected to another end of the second coil, and which outputs to the output terminal via the other end of the second coil from the output end, the low frequency band of the input digital signal passed to the other end of the first coil input to the first and second input ends and a composite signal obtained by combining the direct current component and the direct current bias voltage output from the direct current voltage generator; and
a frequency characteristic compensating circuit connected between a reference electrical potential point and the second input end of the operational amplifier or between the second input end and the output end, the compensating circuit being adopted to compensate for a frequency characteristic so that a gain of the operational amplifier increases with a component having a higher frequency from among the low frequency bands of the input digital signal passed to the other end of the first coil.

2. The digital signal offset adjusting apparatus according to claim 1, characterized in that, when the first and second input ends of the operational amplifier are a non-inverted input end and an inverted input end, respectively, an input matching resistor having a predetermined value is connected between the reference electrical potential point and the non-inverted input end of the operational amplifier, a feedback resistor is connected between the output end and the inverted input end of the operational amplifier, an output matching resistor having a predetermined value is connected between the output end of the operational amplifier and the other end of the second coil, and a direct current inputting resistor having a predetermined value is connected between the inverted input end of the operational amplifier and the direct current voltage generator, whereby a subtracted and combined signal obtained by subtracting and combining by the operational amplifier the low frequency band and the direct current component of the input digital signal passed to the other end of the first coil input to the inverted input end of the operational amplifier and the direct current bias voltage from the direct current voltage generator input to the non-inverted input end of the operational amplifier is output to the output terminal via the other end of the second coil from the output end of the operational amplifier.

3. The digital signal offset adjusting apparatus according to claim 2, characterized in that the direct current inputting resistor connected between the inverted input end of the operational amplifier and the direct current voltage generator has a value equal to a value of the feedback resistor connected between the output end of the operational amplifier and the inverted input end as the predetermined value, and the frequency characteristic compensating circuit is composed of a capacitor and a resistor connected in serial between the inverted input end and the reference electronic potential point of the operational amplifier.

4. The digital signal offset adjusting apparatus according to claim 2, characterized in that the frequency characteristic compensating circuit is composed of a serial circuit of a coil and a resistor connected between the output end and the inverted input end of the operational amplifier, and the direct current inputting resistor connected between the inverted input end of the operational amplifier and the direct current voltage generator has a value equal to a parallel combined resistance value of the feedback resistor of the operational amplifier and the resistor of the frequency characteristic compensating circuit as the predetermined value.

5. The digital signal offset adjusting apparatus according to claim 4, characterized in that the frequency characteristic compensating circuit is compatible with the feedback resistor connected between the output end and the inverted input end of the operational amplifier by means of the resistor of the frequency characteristic compensating circuit, and is composed of a coil connected in series between the resistor compatible with the feedback resistor and the inverted input end, and a resistance value of the resistor of the frequency characteristic compensating circuit compatible with the feedback resistor of the operational amplifier is set to be equal to a resistance value of the direct current inputting resistor from the direct current voltage generator.

6. A digital signal offset adjusting apparatus comprising:
an input terminal to which an input digital signal having a wideband frequency characteristic including a low frequency band, a direct current component, and a high frequency band is input;
a direct current voltage generator which outputs a desired direct current bias voltage;
an output terminal to output an output digital signal obtained by applying the direct current bias voltage output from the direct current voltage generator to the low frequency band, the direct current component, and the high frequency band of the input digital signal input to the input terminal;
a capacitor which is connected between the input terminal and the output terminal and which causes the output terminal to pass through the high frequency band of the input digital signal input to the input terminal;
a first coil whose one end is connected to the input terminal, and which passes the low frequency band and the direct current component of the input digital signal to another end;
a second coil whose one end is connected to the output terminal;
a first operational amplifier, a first input end of which is connected to the other end of the first coil, a second input end of which is connected to a reference electrical potential point, and which outputs from an output end a first inverted and amplified signal obtained by inverting and amplifying the low frequency band and the direct current component of the input digital signal passed to the other end of the first coil;
a second operational amplifier, a first input end of which is connected to the direct current voltage generator, a second input end of which is connected to the reference electrical potential point, and which outputs from an output end a second inverted and amplified signal obtained by inverting and amplifying the direct current bias voltage output from the direct current voltage generator;
a third operational amplifier, a first input end of which is connected in common to each of the output ends of the first and second operational amplifiers, a second input end of which is connected to the reference electrical potential point, and which inverts and amplifies a combined signal obtained by combining the first and second inverted and amplified signals and outputs the inverted and amplified signal to the other end of the second coil; and
first and second frequency characteristic compensating circuits connected between the reference electrical potential point and each of the first input end of the first and third operational amplifiers or between each of the first input end and the output end of the first and third operational amplifiers, the first and second frequency characteristic compensating circuits being adopted to compensate for a frequency characteristic so that a gain of each of the first and third operational amplifiers increases with a component having a higher frequency from among the low frequency bands of the input digital signal passed to the other end of the first coil.

7. The digital signal offset adjusting apparatus according to claim 6, characterized in that, when the first and second input ends of the first to third operational amplifiers are an inverted input end and a noninverted input end, respectively, each of the non-inverted input ends of the first to third operational amplifiers is connected to the reference electrical potential point, an input matching resistor having a predetermined value is connected between the inverted input end and the reference electrical potential point of the first operational amplifier, first to third feedback resistors are connected, respectively, between the output end and the inverted input end of each of the first to third operational amplifiers, a direct current inputting resistor having a predetermined value is connected between the inverted input end of the second operational amplifier and the direct current voltage generator, first and second output matching resistors each having a predetermined value are connected, respectively, between the output end of each of the first and second operational amplifiers and the inverted input end of the third operational amplifier, and a third output matching resistor having the predetermined value is connected between the output end of the third operational amplifier and the other end of the second coil, whereby an added and combined signal obtained by adding and combining the first and second inverted and amplified signals output from each of the output ends of the first and second operational amplifiers is output to the output terminal via the other end of the second coil from the output end of the third operational amplifier which inverts and amplifies the added and combined signal.

8. The digital signal offset adjusting apparatus according to claim 7, characterized in that the direct current inputting resistor connected between the inverted input end of the second operational amplifier and the direct current voltage generator has a value equal to a value of the second feedback resistor connected between the output end and the inverted input end of the second operational amplifier as the predetermined value, and the first and second frequency characteristic compensating circuits are composed of a capacitor and a resistor connected in series, respectively, between the reference electrical potential point and each of the inverted input end of the first and third operational amplifiers.

9. The digital offset adjusting apparatus according to claim 7, characterized in that the direct current inputting resistor connected between the inverted input end of the second operational amplifier and the direct current voltage generator has a value equal to a value of the second feedback resistor connected between the output end and the inverted input end of the second operational amplifier as the predetermined value, and the first and second frequency characteristic compensating circuits are composed of a serial circuit of a coil and a resistor connected between each of the output end and the inverted input end of the first and third operational amplifiers, respectively.

10. The digital offset adjusting apparatus according to claim 9, characterized in that the first and second frequency characteristic compensating circuits are compatible with the first and third feedback resistors connected between the output end and the inverted input end of each of the first and third operational amplifiers by a resistor of each of the first and second frequency characteristic compensating circuits, respectively, and are composed of a coil connected in series between each of the resistors compatible with the first and third feedback resistors and each of the inverted input ends of the first and third operational amplifiers.

11. A pulse pattern generator comprising:
a digital signal output section which outputs a digital signal having a wideband frequency characteristic including a low frequency band, a direct current component, and a high frequency band, the digital signal being of a desired pulse pattern including a data pattern such that identical bit data are continuous; and
a digital signal offset adjusting apparatus connected to the digital signal output section, wherein the digital signal offset adjusting apparatus comprises:
an input terminal to which a digital signal of a desired pulse pattern having a wideband frequency characteristic including the low frequency band, the direct current component, and the high frequency band output from the digital signal output section is input as an input digital signal;
a direct current voltage generator which outputs a desired direct current bias voltage;
an output terminal to output an output digital signal obtained by applying the direct current bias voltage output from the direct current voltage generator to the low frequency band, the direct current component, and the high frequency band of the input digital signal input to the input terminal;
a capacitor which is connected between the input terminal and the output terminal, and which causes the output terminal to pass through the high frequency band of the input digital signal input to the input terminal;
a first coil, one end of which is connected to the input terminal, and which passes the low frequency band and the direct current component of the input digital signal to another end; a second coil, one end of which is connected to the output terminal;
an operational amplifier, a first input end of which is connected to the other end of the first coil, a second input end of which is connected to the direct current voltage generator, an output end of which is connected to another end of the second coil, and which outputs to the output terminal via the other end of the second coil from the output end, the low frequency band of the input digital signal passed to the other end of the first coil input to the first and second input ends and a composite signal obtained by combining the direct current component and the direct current bias voltage output from the direct current voltage generator; and
a frequency characteristic compensating circuit connected between a reference electrical potential point and the second input end of the operational amplifier or between the second input end and the output end, the compensating circuit being adopted to compensate for a frequency characteristic so that a gain of the operational amplifier increases with a component having a higher frequency from among the low frequency bands of the input digital signal passed to the other end of the first coil.

12. The pulse pattern generator according to claim 11, characterized in that, when the first and second input ends of the operational amplifier of the digital signal offset adjusting apparatus are a non-inverted input end and an inverted input end, respectively, an input matching resistor having a predetermined value is connected between the reference electrical potential point and the non-inverted input end of the operational amplifier, a feedback resistor is connected between the output end and the inverted input end of the operational amplifier, an output matching resistor having a predetermined value is connected between the output end of the operational amplifier and the other end of the second coil, and a direct current inputting resistor having a predetermined value is connected between the inverted input end of the operational amplifier and the direct current voltage generator, whereby a subtracted and combined signal obtained by subtracting and combining by the operational amplifier the low frequency band and the direct current component of the input digital signal passed to the other end of the first coil input to the inverted input end of the operational amplifier and the direct current bias voltage from the direct current voltage generator input to the non-inverted input end of the operational amplifier is output to the output terminal via the other end of the second coil from the output end of the operational amplifier.

13. The pulse pattern generator according to claim 12, characterized in that the direct current inputting resistor connected between the inverted input end of the operational amplifier and the direct current voltage generator has a value equal to a value of the feedback resistor connected between the output end of the operational amplifier and the inverted input end as the predetermined value, and the frequency characteristic compensating circuit is composed of a capacitor and a resistor connected in serial between the inverted input end and the reference electronic potential point of the operational amplifier.

14. The pulse pattern generator according to claim 12, characterized in that the frequency characteristic compensating circuit is composed of a serial circuit of a coil and a resistor connected between the output end and the inverted input end of the operational amplifier, and the direct current inputting resistor connected between the inverted input end of the operational amplifier and the direct current voltage generator has a value equal to a parallel combined resistance value of the feedback resistor of the operational amplifier and the resistor of the frequency characteristic compensating circuit as the predetermined value.

15. The pulse pattern generator according to claim 14, characterized in that the frequency characteristic compensating circuit is compatible with the feedback resistor connected between the output end and the inverted input end of the operational amplifier by means of the resistor of the frequency characteristic compensating circuit, and is composed of a coil connected in series between the resistor compatible with the feedback resistor and the inverted input end, and a resistance value of the resistor of the frequency characteristic compensating circuit compatible with the feedback resistor of the operational amplifier is set to be equal to a resistance value of the direct current inputting resistor from the direct current voltage generator.

16. A pulse pattern generator comprising:
a digital signal output section which outputs a digital signal having a wideband frequency characteristic including a low frequency band, a direct current component, and a high frequency band, the digital signal being of a desired pulse pattern including a data pattern such that identical bit data are continuous; and
a digital signal offset adjusting apparatus connected to the digital signal output section, wherein the digital signal offset adjusting apparatus comprises:
an input terminal to which a digital signal of a desired pulse pattern having a wideband frequency characteristic including the low frequency band, the direct current component, and the high frequency band output from the digital signal output section is input as an input digital signal;
a direct current voltage generator which outputs a desired direct current bias voltage;
an output terminal to output an output digital signal obtained by applying the direct current bias voltage output from the direct current voltage generator to the low frequency band, the direct current component, and the high frequency band of the input digital signal input to the input terminal;
a capacitor which is connected between the input terminal and the output terminal, and which causes the output terminal to pass through the high frequency band of the input digital signal input to the input terminal;
a first coil, one end of which is connected to the input terminal, and which passes the low frequency band and the direct current component of the input digital signal to another end;
a second coil, one end of which is connected to the output terminal;
a first operational amplifier, a first input end of which is connected to the other end of the first coil, a second input end of which is connected to a reference electrical potential point, and which outputs from an output end a first inverted and amplified signal obtained by inverting and amplifying the low frequency band and the direct current component of the input digital signal passed to the other end of the first coil;
a second operational amplifier, a first input end of which is connected to the direct current voltage generator, a second input end of which is connected to the reference electrical potential point, and which outputs from an output end a second inverted and amplified signal obtained by inverting and amplifying the direct current bias voltage output from the direct current voltage generator;
a third operational amplifier, a first input end of which is connected in common to each of the output ends of the first and second operational amplifiers, a second input end of which is connected to the reference electrical potential point, and which inverts and amplifies a combined signal obtained by combining the first inverted and amplified signals and outputs the inverted and amplified signal to another end of the second coil; and first and second frequency characteristic compensating circuits connected between the reference electrical potential point and each of the first input end of the first and third operational amplifiers or between each of the first input end and the output end of the first and third operational amplifiers, the first and second frequency characteristic compensating circuits being adopted to compensate for a frequency characteristic so that a gain of each of the first and third operational amplifiers increases with a component having a higher frequency from among the low frequency bands of the input digital signal passed to the other end of the first coil.

17. The pulse pattern generator according to claim 16, characterized in that, when the first and second input ends of the first to third operational amplifiers of the digital signal offset adjusting apparatus are an inverted input end and a non-inverted input end, respectively, each of the non-inverted input ends of the first to third operational amplifiers is connected to the reference electrical potential point, an input matching resistor having a predetermined value is connected between the inverted input end and the reference electrical potential point of the first operational amplifier, first to third feedback resistors are connected, respectively, between the output end and the inverted input end of each of the first to third operational amplifiers, a direct current inputting resistor having a predetermined value is connected between the inverted input end of the second operational amplifier and the direct current voltage generator, first and second output matching resistors each having a predetermined value are connected, respectively, between the output end of each of the first and second operational amplifiers and the inverted input end of the third operational amplifier, and a third output matching resistor having the predetermined value is connected between the output end of the third operational amplifier and the other end of the second coil, whereby an added and combined signal obtained by adding and combining the first and second inverted and amplified signals output from each of the output ends of the first and second operational amplifiers is output to the output terminal via the other end of the second coil from the output end of the third operational amplifier which inverts and amplifies the added and combined signal.

18. The pulse pattern generator according to claim 17, characterized in that the direct current inputting resistor connected between the inverted input end of the second operational amplifier and the direct current voltage generator has a value equal to a value of the second feedback resistor connected between the output end and the inverted input end of the second operational amplifier as the predetermined value, and the first and second frequency characteristic compensating circuits are composed of a capacitor and a resistor connected in series, respectively, between the reference electrical potential point and each of the inverted input end of the first and second operational amplifiers.

19. The pulse pattern generator according to claim 17, characterized in that the direct current inputting resistor connected between the inverted input end of the second operational amplifier and the direct current voltage generator has a value equal to a value of the second feedback resistor connected between the output end and the inverted input end of the second operational amplifier as the predetermined value, and the first and second frequency characteristic compensating circuits are composed of a serial circuit of a coil and a resistor connected between each of the output end and the inverted input end of the first and third operational amplifiers, respectively.

20. The pulse pattern generator according to claim 19, characterized in that the first and second frequency characteristic compensating circuits are compatible with the first and third feedback resistors connected between the output end and the inverted input end of each of the first and third operational amplifiers by a resistor of each of the first and second frequency characteristic compensating circuits, respectively, and are composed of a coil connected in series between each of the resistors compatible with the first and third feedback resistors and each of the inverted input ends of the first and third operational amplifiers.

* * * * *